United States Patent
Debnath et al.

(10) Patent No.: US 10,790,807 B1
(45) Date of Patent: Sep. 29, 2020

(54) QUANTUM LOGIC GATE DESIGN AND OPTIMIZATION

(71) Applicant: IONQ, INC., College Park, MD (US)

(72) Inventors: Shantanu Debnath, College Park, MD (US); Jason M. Amini, Takoma Park, MD (US); Jwo-Sy Chen, Greenbelt, MD (US); Neal Pisenti, Baltimore, MD (US)

(73) Assignee: IONQ, INC., College Park, MD (US)

( * ) Notice: Subject to any disclaimer, the term of this patent is extended or adjusted under 35 U.S.C. 154(b) by 0 days.

(21) Appl. No.: 16/817,482

(22) Filed: Mar. 12, 2020

Related U.S. Application Data

(63) Continuation of application No. 16/396,634, filed on Apr. 27, 2019, now Pat. No. 10,622,978.

(60) Provisional application No. 62/830,229, filed on Apr. 5, 2019.

(51) Int. Cl.
*G06N 99/00* (2019.01)
*H03K 3/38* (2006.01)
*G06N 10/00* (2019.01)
*H03K 19/195* (2006.01)

(52) U.S. Cl.
CPC ............... *H03K 3/38* (2013.01); *G06N 10/00* (2019.01); *H03K 19/195* (2013.01)

(58) Field of Classification Search
CPC .......... G06N 10/00; H03K 3/38; H03K 19/195
See application file for complete search history.

(56) References Cited

U.S. PATENT DOCUMENTS

| | | | | |
|---|---|---|---|---|
| 8,633,437 B2* | 1/2014 | Dantus | .................. | G01N 21/65 250/281 |
| 9,335,606 B2* | 5/2016 | Hanson | ................... | B82Y 10/00 |
| 9,858,531 B1* | 1/2018 | Monroe | ................... | G06F 15/76 |
| 2006/0249670 A1* | 11/2006 | Monroe | ................ | G06N 10/00 250/283 |
| 2009/0213444 A1* | 8/2009 | Goto | ...................... | B82Y 10/00 359/107 |
| 2018/0114138 A1 | 4/2018 | Monroe et al. | | |

OTHER PUBLICATIONS

G.-D. Lin et al. "Large-scale quantum computation in an anharmonic linear ion trap", Published Jul. 9, 2009 • Europhysics Letters Association, EPL (Europhysics Letters), vol. 86 No. 6.

(Continued)

*Primary Examiner* — Alexander H Taningco
*Assistant Examiner* — Kurtis R Bahr
(74) *Attorney, Agent, or Firm* — Patterson & Sheridan, LLP.; Joseph J. Stevens; Fumiko Yamaguchi

(57) ABSTRACT

A method of performing a computational process using a quantum computer includes generating a laser pulse sequence comprising a plurality of laser pulse segments used to perform an entangling gate operation on a first trapped ion and a second trapped ion of a plurality of trapped ions that are aligned in a first direction, each of the trapped ions having two frequency-separated states defining a qubit, and applying the generated laser pulse sequence to the first and second trapped ions. Each of the plurality of laser pulse segments has a pulse shape with ramps formed using a spline at a start and an end of each of the plurality of laser pulse segments.

20 Claims, 22 Drawing Sheets

(56) References Cited

OTHER PUBLICATIONS

Yukai Wu, "Noise Analysis for High-Fidelity Quantum Entangling Gates in an Anharmonic Linear Paul Trap", Physical Review A 97, 062325 (2018). 16 pages.
T. Choi, "Optimal Quantum Control of Multimode Couplings between Trapped Ion Qubits for Scalable Entanglement"< Physical Review Letters. May 16, 2014.
A. Sorensen, K. Molmer, Quantum computation with ions in thermal motion. Phys. Rev. Lett. 82, 1971-1974 (1999).
K. Molmer, A. Sorensen, Multiparticle entanglement of hot trapped ions. Phys. Rev. Lett. 82, 1835-1838 (1999).
S.-L. Zhu, C. Monroe, L.-M. Duan, Arbitrary-speed quantum gates within large ion crystals through minimum control of laser beams. Europhys. Lett. 73, 485-491 (2006).
K. Wright et al., Benchmarking an 11-qubit quantum computer. https://arxiv.org/abs/1903.08181 <https://protect-us.mimecast.com/s/69n6C82z7xhOkYxCnW239?domain=arxiv.org> (2019).
S. Debnath, N. M. Linke, C. Figgatt, K. A. Landsman, K. Wright, C. Monroe, Demonstration of a small programmable quantum computer with atomic qubits. Nature 536, 63{66 (2016).
N. M. Linke, D. Maslov, M. Roetteler, S. Debnath, C. Figgatt, K. A. Landsman, K. Wright, C. Monroe, Experimental comparison of two quantum computing architectures. Proc. Natl. Acad. Sci. U.S.A. 114, 3305-3310 (2017).
Shi-Liang Zhu, C. Monroe, and L.-M. Duan1 , Trapped Ion Quantum Computation with Transverse Phonon Modes , Phys. Rev. Lett. 97, 050505 (2006).
A. W. Harrow, A. Hassidim, S. Llyod, Quantum algorithm for solving linear systems of equations. Phys. Rev. Lett. 15, 150502 (2009).
M. Benedetti, D. Garcia-Pintos, O. Perdomo, V. Leyton-Ortega, Y. Nam, A. Perdomo-Ortiz, A generative modeling approach for benchmarking and training shallow quantum circuits. https://arxiv.org/abs/1801.07686 (2018).
P. W. Shor, Polynomial-time algorithms for prime factorization and discrete logarithms on a quantum computer. SIAM Rev. 41, 303{332 (1999).
M. Reiher, N. Wiebe, K. M. Svore, D.Wecker, M. Troyer, Elucidating reaction mechanisms on quantum computers. Proc. Natl. Acad. Sci. U.S.A. 114, 7555{7560 (2017).
Y. Nam and D. Maslov, Low cost quantum circuits for classically intractable instances of the Hamiltonian dynamics simulation problem. https://arxiv.org/abs/1805.04645 (2018).
S. Lloyd, M. Mohseni, P. Rebentrost, Quantum principal component analysis. Nat. Phys. 10, 631 (2014).
R. Or us, S. Mugel, E. Lizaso, Quantum computing for finance: overview and prospects. https://arxiv.org/abs/1807.03890 (2019).
K. Wright et al., Benchmarking an 11-qubit quantum computer. https://arxiv.org/abs/1903.08181 (2019).
M. A. Nielsen, I. L. Chuang, Quantum Computation and Quantum Information (Cambridge Univ. Press, New York, NY, 2000).
K. M Imer, A. S rensen, Multiparticle entanglement of hot trapped ions. Phys. Rev. Lett. 82, 1835-1838 (1999).
S.-L. Zhu, C. Monroe, L.-M. Duan, Arbitrary-speed quantum gates within large ion crystals through minimum control of laser beams. Europhys. Lett. 73, 485 (2006).
T. Choi, S. Debnath, T. A. Manning, C. Figgatt, Z.-X. Gong, L.-M. Duan, and C. Monroe, Optimal Quantum Control of Multimode Couplings between Trapped Ion Qubits for Scalable Entanglement. Phys. Rev. Lett. 112, 190502 (2014).
J. P. Gaebler, T. R. Tan, Y. Lin, Y. Wan, R. Bowler, A. C. Keith, S. Glancy, K Coakley, E. Knill, D. Leibfried, D. J. Wineland, High-delity universal gate set for 9Be+ion qubits. Phys. Rev. Lett. 117, 060505 (2016).
C. J. Ballance, T. P. Harty, N. M. Linke, M. A. Sepiol, D. M. Lucas, High-delity quantum logic gates using trapped-ion hyper ne qubits. Phys. Rev. Lett. 117, 060504 (2016).
T. P. Harty, D. T. C. Allcock, C. J. Ballance, L. Guidoni, H. A. Janacek, N. M. Linke, D. N. Stacey, D. M. Lucas, High-delity preparation, gates, memory, and readout of a trapped-ion quantum bit. Phys. Rev. Lett. 113, 220501 (2014).
P. H. Leung, K. A. Landsman, C. Figgatt, N. M. Linke, C. Monroe, K. R. Brown, Robust 2-qubit gates in a linear ion crystal using a frequency-modulated driving force. Phys. Rev. Lett. 120, 020501 (2018).
T. J. Green, M. J. Biercuk, Phase-modulated decoupling and error suppression in qubit-oscillator systems. Phys. Rev. Lett. 114, 120502 (2015).
Y. Nam et al., Ground-state energy estimation of the water molecule on a trapped ion quantum computer. https://arxiv.org/abs/1902.10171 (2019).
G. E. Crooks, Performance of the quantum approximate optimization algorithm on the maximum cut problem. https://arxiv.orgiabs/1811.08419 (2018).
Y. Nam, Y. Su, D. Maslov, Approximate quantum Fourier transform with O(n log(n)) T gates. https://arxiv.org/abs/1803.04933 (2018).
T. G. Draper, S. A. Kutin, E. M. Rains, K. M. Svore, A logarithmic-depth quantum carry-lookahead adder. Quant. Inf. Comp. 6, 351{369 (2006).
R. Babbush et al., Encoding electronic spectra in quantum circuits with linear T complexity. Phys. Rev. X 8, 041015 (2018).
L. K. Grover, Quantum mechanics helps in searching for a needle in a haystack. Phys. Rev. Lett. 79, 325 (1997).
S. Bravyi, J. Haah, Magic state distillation with low overhead. Phys. Rev. A 86, 052329 (2012).
J. O'Gorman, E. T. Campbell, Quantum computation with realistic magic state factories. Phys. Rev. A 95, 032338 (2017).
F. A. Aloul, A. Ramani, I. L. Markov, K. A. Sakallah, Solving di cult SAT instances in the presence of symmetry. Proc. Des. Automat. Conf. 731{736 (2002).
C. Figgatt, A. Ostrander, N. M. Linke, K. A. Landsman, D. Zhu, D. Maslov, C. Monroe, Parallel entangling operations on a universal ion trap quantum computer. https://arxiv.org/abs/1810.11948 (2018).
Y. Lu, S. Zhang, K. Zhang, W. Chen, Y. Shen, J. Zhang, J.-N. Zhang, K. Kim, Scalable global entangling gates on arbitrary ion qubits. https://arxiv.org/abs/1901.03508 (2019).
N. Grzesiak, R. B● umel, K. Beck, K. Wright, V. Chaplin, J. Amini, N. Pisenti, S. Debnath, J.-S. Chen, Y. Nam, E cient Arbitrary Simultaneously Entangling Gates on a trapped-ion quantum computer. (To appear).
J. T. Merrill, K. R. Brown, Progress in compensating pulse sequences for quantum computation. https://arxiv.org/abs/1203.6392 (2012).
M. X. Goemans, D. P. Williamson, Improved approximation algorithms for maximum cut and satisfability problems using semide nite programming. J. ACM 42, 1115-1145 (1995).
A. M. Childs, D. Maslov, Y. Nam, N. J Ross, Y. Su, Toward the rst quantum simulation with quantum speedup. Proc. Natl. Acad. Sci. U.S.A. 115, 9456{9461 (2018).
V. V. Shende, I. L. Markov, S. S. Bullock, Minimal universal two-qubit controlled-NOT-based circuits. Phys. Rev. A 69, 062321 (2004).
D. Maslov, On the advantages of using relative phase Toolis with an application to multiple control Toffoli optimization. Phys. Rev. A 93, 022311 (2016).
D. J. Wineland, C. Monroe, W. M. Itano, D. Leibfried, B. E. King, D. M. Meekhof, Experimental Issues in Coherent Quantum-State Manipulation of Trapped Atomic Ions. J. Res. Natl. Inst. Stand. Technol. 103, 259-328 (1998).
C. Marquet, F. Schmidt-Kaler, D. F. V. James, Phononphonon interactions due to non-linear effects in a linear ion trap. Appl. Phys. B 76, 199-208 (2003).
Y.Wu, S.-T.Wang, L.-M. Duan, Noise Analysis for High-Fidelity Quantum Entangling Gates in an Anharmonic Linear Paul Trap. Phys. Rev. A 97, 062325 (2018).
E. Hewitt, R. E. Hewitt, The Gibbs-Wilbraham phenomenon: An episode in Fourier analysis, Archive for History of Exact Sciences 21, 129-160 (1979).
G.-D. Lin et al., "Large-scale quantum computation in an anharmonic linear ion trap," Europhysics Letters, vol. 86, No. 6 (Jul. 9, 2009), 60004 (5 pages).

(56) References Cited

OTHER PUBLICATIONS

Yukai Wu et al., "Noise Analysis for High-Fidelity Quantum Entangling Gates in an Anharmonic Linear Paul Trap", Physical Review A, vol. 97(Jun. 19, 2018), 062325 (16 pages).

T. Choi et al., "Optimal Quantum Control of Multimode Couplings between Trapped Ion Qubits for Scalable Entanglement," Physical Review Letters, vol. 112 (May 16, 2014), 190502 (5 pages).

L. K. Grover, Quantum mechanics helps in searching for a needle in a haystack. Phys. Rev. Lett. 79, 325{328 (1997).

R. P. Feynman, Simulating physics with computers. Int. J. Theor. Phys. 21, 467-488 (1982).

Y. Wang, M. Um, J. Zhang, S. An, M. Lyu, J.-N. Zhang, L.-M. Duan, D. Yum, K. Kim, Single-qubit quantum memory exceeding ten-minute coherence time. Nat. Photonics 11, 646{650 (2017).

C. J. Ballance, T. P. Harty, N. M. Linke, M. A. Sepiol, D. M. Lucas, High-fidelity quantum logic gates using trapped-ion hyperfne qubits. Phys. Rev. Lett. 117,060504 (2016).

D. Maslov, Y. S. Nam, J. Kim, An outlook for quantum computing, Proc. IEEE, 107, 5-10 (2019).

Y. Nam, D. Maslov, Low cost quantum circuits for classically intractable instances of the Hamiltonian dynamics simulation problem. https://arxiv.org/abs/1805.04645 (2018).

T. Choi, S. Debnath, T. A. Manning, C. Figgatt, Z.-X. Gong, L.-M. Duan, C. Monroe, Optimal quantum control of multimode couplings between trapped ion qubits for scalable entanglement. Phys. Rev. Lett. 112, 190502 (2014).

S. Boyd, L. Vandenberghe, Convex Optimization (Cambridge Press, New York, NY, 2004).

S. Beauregard, Circuit for Shors algorithm using 2n+3 qubits. Quant. Inf. Comp. 3, 175-185 (2003).

D. Maslov, Y. Nam, Use of global interactions in efficient quantum circuit constructions. New J. Phys. 20, 033018 (2018).

E. Bernstein, U. Vazirani, Quantum complexity theory SIAM J. Comput. 26, 1411-1473 (1997).

W. van Dam, S. Hallgren, L. Ip, Quantum algorithms for some hidden shift problems. SIAM J. Comput. 36, 763-778 (2006).

F. A. Calderon-Vargas, G. S. Barron, X.-H. Deng, A. J. Sigillito, E. Barnes, S. E. Economou, Fast high-fidelity entangling gates in Si double quantum dots. https://arxiv.org/abs/1902.02350 (2019).

L. S. Theis, F. Motzoi, F. K. Wilhelm, M. Saman, High-fidelity Rydberg-blockade entangling gate using shaped, analytic pulses. Phys. Rev. A 94, 032306 (2016).

M. M. ★ uller, H. R. Haakh, T. Calarco, C. P. Koch, C. Henkel, Prospects for fast Rydberg gates on an atom chip. Quant. Inf. Process. 10, 771792 (2011).

J. M. Gambetta, F. Motzoi, S. T. Merkel, F. K. Wilhelm, Analytic control methods for high-delity unitary operations in a weakly nonlinear oscillator. Phys. Rev. A 83, 012308 (2011).

A. So☐ orl, T. Schulte-Herb☐ uggen, S. J. Glaser, V. Bergholm, M. J. Storcz, J. Ferber, F. K. Wilhelm, Optimal control of coupled Josephson qubits. Phys. Rev. A75, 012302 (2007).

G. M. Amdahl, Validity of the single processor approach to achieving large scale computing capabilities. AFIPS Conf. Proc. 30, 483{485 (1967).

Pak Hong Leung et al. "Entangling an Arbitrary Prior of Qubits in a Long Ion Crystal", ARXIV.org, Cornell University Library, 201 Olin Library Cornell University Ithaca, NY 14853, Aug. 7, 2018, XP081096658, DOI: 10.1103/Physreva.8.032218.

International Search Report dated May 29, 2020 for Application PCT/US2020/015232.

\* cited by examiner

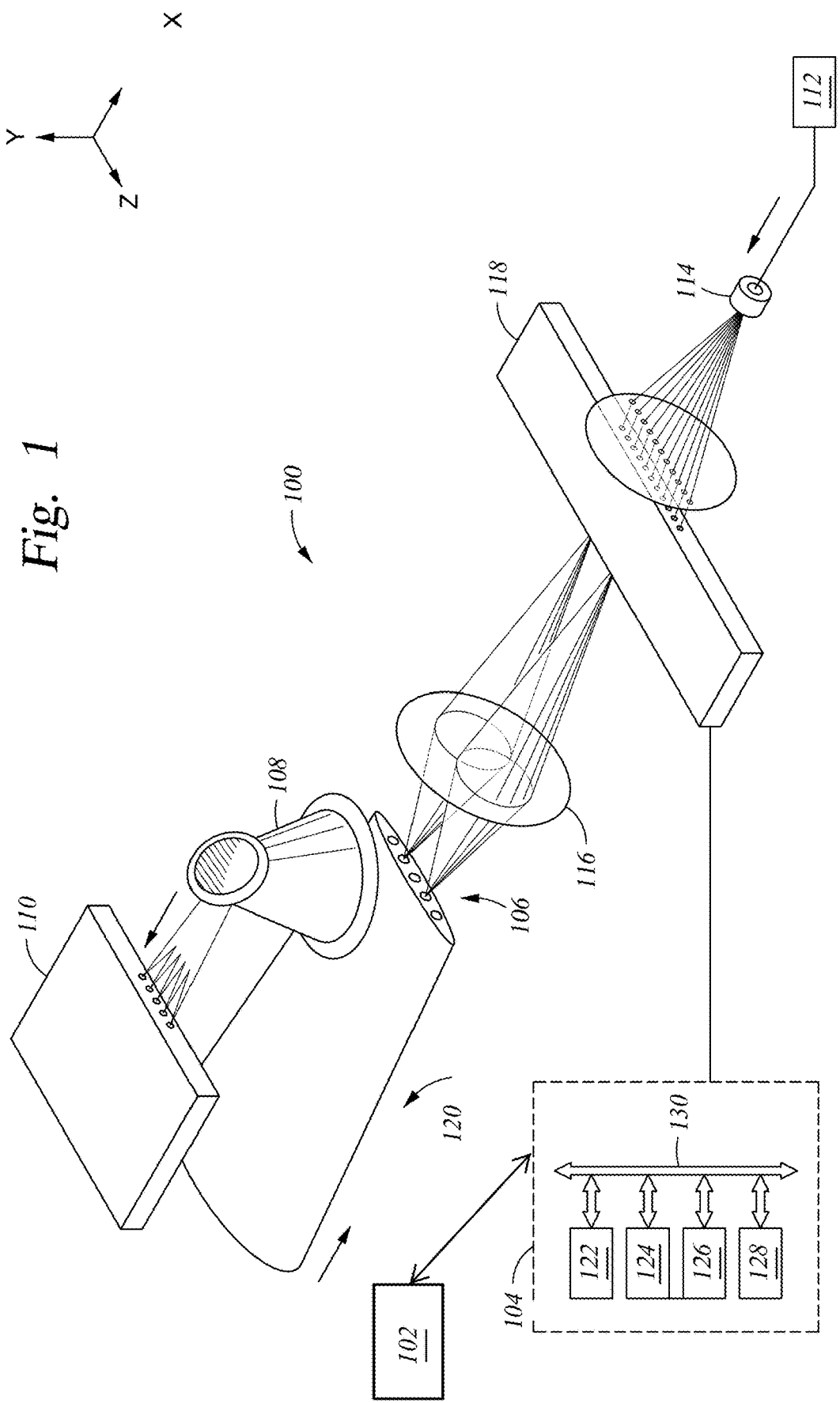

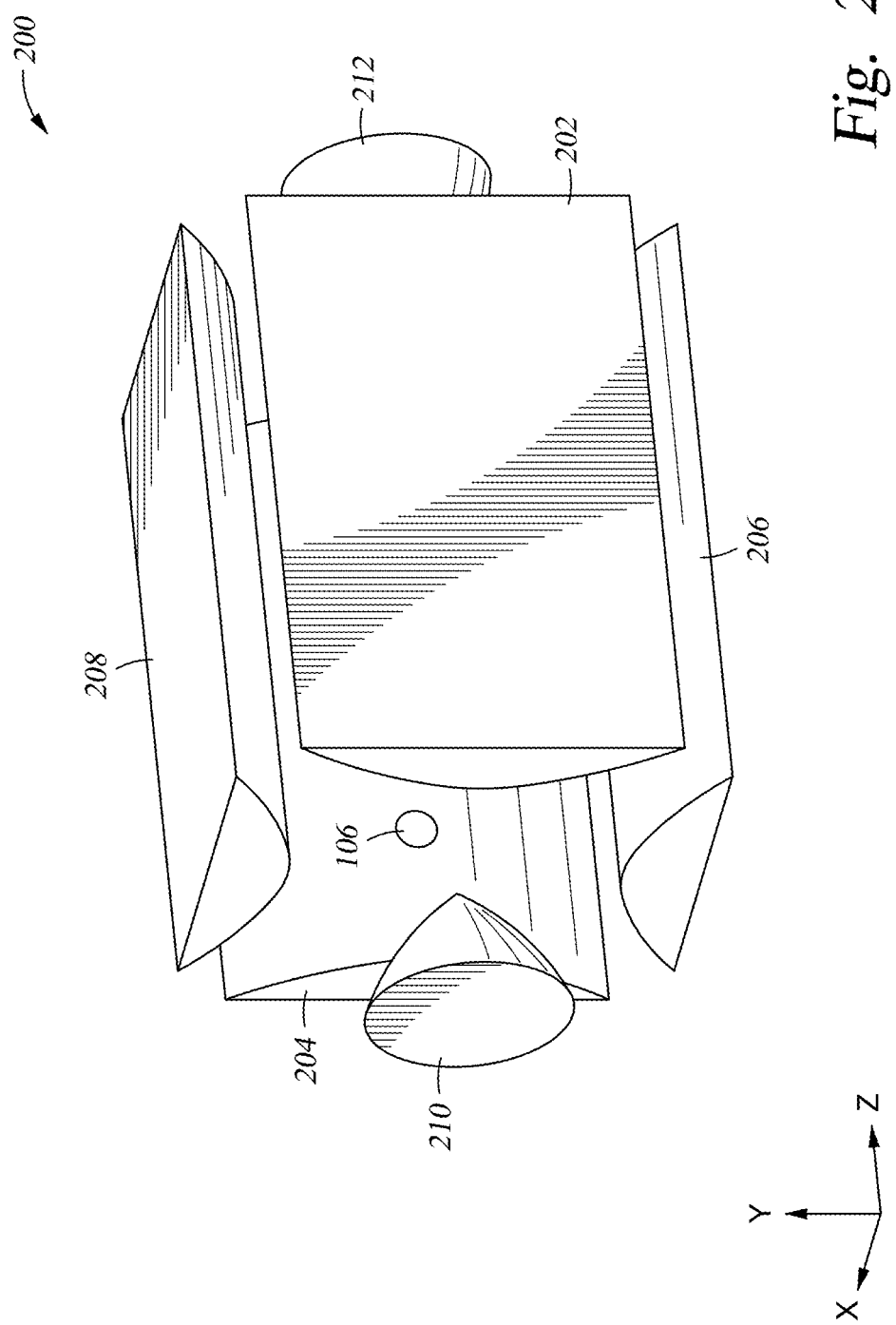

QUANTUM LOGIC GATE DESIGN AND OPTIMIZATION

CROSS-REFERENCE TO RELATED APPLICATIONS

This application is a continuation of co-pending U.S. patent application Ser. No. 16/396,634, filed Apr. 27, 2019, which claims the benefit to U.S. Provisional Application No. 62/830,229, filed Apr. 5, 2019. Each of the aforementioned related patent applications is herein incorporated by reference.

BACKGROUND

Field

The present disclosure generally relates to a method of generating an entangling gate in an ion trap quantum computer, and more specifically, to a method of optimizing a laser pulse sequence to generate the entangling gate.

Description of the Related Art

In quantum computing, quantum bits or qubits, which are analogous to bits representing a "0" and a "1" in a classical (digital) computer, are required to be prepared, manipulated, and measured (read-out) with near perfect control during a computation process. Imperfect control of the qubits leads to errors that can accumulate over the computation process, limiting the size of a quantum computer that can perform reliable computations.

Among physical systems upon which it is proposed to build large-scale quantum computers, is a group of ions (e.g., charged atoms), which are trapped and suspended in vacuum by electromagnetic fields. The ions have internal hyperfine states which are separated by frequencies in the several GHz range and can be used as the computational states of a qubit (referred to as "qubit states"). These hyperfine states can be controlled using radiation provided from a laser, or sometimes referred to herein as the interaction with laser beams. The ions can be cooled to near their motional ground states using such laser interactions. The ions can also be optically pumped to one of the two hyperfine states with high accuracy (preparation step of qubits), manipulated between the two hyperfine states (single-qubit gate operations) by laser beams, and their internal hyperfine states detected by fluorescence upon application of a resonant laser beam (read-out of qubits). A pair of ions can be controllably entangled (two-qubit gate operations) by qubit-state dependent force using laser pulses that couple the ions to the collective motional modes of a chain of trapped ions, which arise from their Coulombic interaction between the ions. In general, entanglement occurs when pairs or groups of ions (or particles) are generated, interact, or share spatial proximity in ways such that the quantum state of each ion cannot be described independently of the quantum state of the others, even when the ions are separated by a large distance.

As the size of the chain of ions increases, these gate operations are more susceptible to external noise, decoherence, speed limitations, or the like. Therefore, there is a need for a method of optimizing a laser pulse sequence to implement, for instance, the entangling gate which avoids these problems.

SUMMARY

A method of performing a computational process using a quantum computer includes generating a laser pulse sequence comprising a plurality of laser pulse segments used to perform an entangling gate operation on a first trapped ion and a second trapped ion of a plurality of trapped ions that are aligned in a first direction, each of the trapped ions having two frequency-separated states defining a qubit, and applying the generated laser pulse sequence to the first and second trapped ions. Each of the plurality of laser pulse segments has a pulse shape with ramps formed using a spline at a start and an end of each of the plurality of laser pulse segments.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1 is a schematic partial view of an ion trap quantum computing system according to one embodiment.

FIG. 2 depicts a schematic view of an ion trap for confining ions in a group according to one embodiment.

Figure 3A:
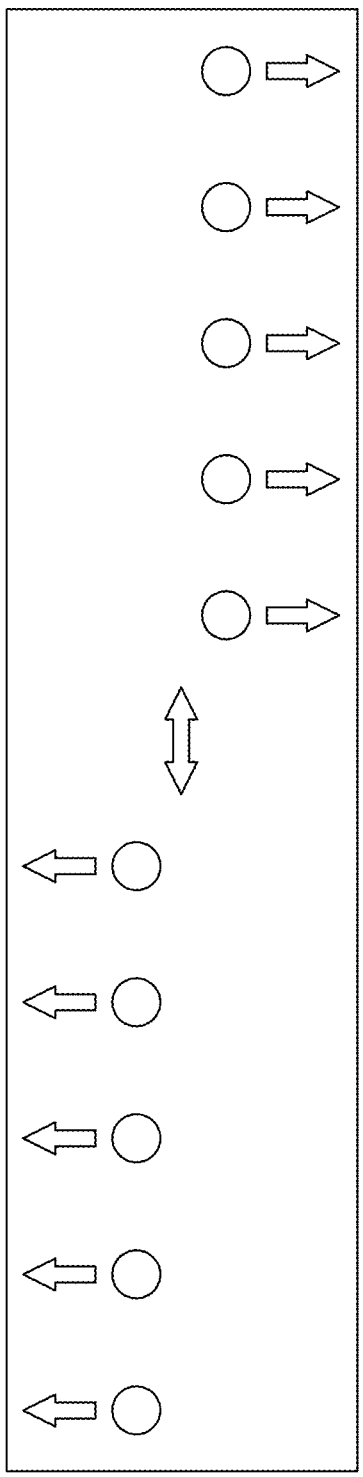
FIGS. 3A, 3B, and 3C depict a few schematic collective transverse motional mode structures of a chain of five trapped ions.

To facilitate understanding, identical reference numerals have been used, where possible, to designate identical elements that are common to the figures. In the figures and the following description, an orthogonal coordinate system including an X-axis, a Y-axis, and a Z-axis is used. The directions represented by the arrows in the drawing are assumed to be positive directions for convenience. It is contemplated that elements disclosed in some embodiments may be beneficially utilized on other implementations without specific recitation.

DETAILED DESCRIPTION

Embodiments described herein are generally related to a method and a system for designing, optimizing and delivering a laser pulse sequence to perform an entangling gate operation between two ions during a quantum computation, and, more specifically, to a laser pulse sequence that increases the fidelity, or the probability that at least two ions are in the intended quantum state(s), of the entangling gate operation between two ions. The optimized laser pulse sequence includes multiple time-segmented laser pulses in which an intensity of at least a portion of each time-segmented laser pulse has a desired intensity level that is gradually ramped at a start and an end of the time-segmented laser pulse with splines (e.g., functions defined piecewise by one or more polynomials or other algebraic expressions), thereby increasing the fidelity of the entangling gate operation.

In quantum computation, any number of desired computational operations can be constructed using one of several known universal gate sets. A universal quantum computer can be built by the use of a universal gate set. The universal gate sets includes a universal gate set, commonly denoted as {R, XX}, which is native to a quantum computing system of trapped ions described herein. Here, the gate R corresponds to manipulation of individual quantum states of trapped ions, and the gate XX corresponds to manipulation of the entanglement of two trapped ions. For those of ordinary skill in the art, it should be clear the gate R can be implemented with near perfect fidelity, while the formation of the gate XX is complex and requires optimization for a given type of trapped ions, number of ions in a chain of trapped ions, and the hardware and environment in which the trapped ions are trapped, to name just a few factors, such that the fidelity of the gate XX is increased and computational errors within a quantum computer are avoided or decreased. In the following discussion, methods of generating and optimizing a laser pulse sequence used to perform computations based on the formation of a gate XX that has an improved fidelity will be described.

General Hardware Configurations

FIG. 1 is a schematic partial view of an ion trap quantum computing system, or system 100, according to one embodiment. The system 100 includes a classical (digital) computer 102, a system controller 104 and a quantum processor that includes a group 106 of trapped ions (i.e., five shown) that extend along the Z-axis. The classical computer 102 includes a central processing unit (CPU), memory, and support circuits (or I/O). The memory is connected to the CPU, and may be one or more of a readily available memory, such as a read-only memory (ROM), a random access memory (RAM), floppy disk, hard disk, or any other form of digital storage, local or remote. Software instructions, algorithms and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like.

An imaging objective 108, such as an objective lens with a numerical aperture (NA), for example, of 0.37, collects fluorescence along the Y-axis from the ions and maps each ion onto a multi-channel photo-multiplier tube (PMT) 110 for measurement of individual ions. Non-copropagating Raman laser beams from a laser 112, which are provided along the X-axis, perform operations on the ions. A diffractive beam splitter 114 creates an array of static Raman beams 116 that are individually switched using a multi-channel acousto-optic modulator (AOM) 118 and is configured to selectively act on individual ions. A global Raman laser beam 120 illuminates all ions at once. The system controller (also referred to as a "RF controller") 104 controls the AOM 118 and thus controls laser pulses to be applied to trapped ions in the group 106 of trapped ions. The system controller 104 includes a central processing unit (CPU) 122, a read-only memory (ROM) 124, a random access memory (RAM) 126, a storage unit 128, and the like. The CPU 122 is a processor of the system controller 104. The ROM 124 stores various programs and the RAM 126 is the working memory for various programs and data. The storage unit 128 includes a nonvolatile memory, such as a hard disk drive (HDD) or a flash memory, and stores various programs even if power is turned off. The CPU 122, the ROM 124, the RAM 126, and the storage unit 128 are interconnected via a bus 130. The system controller 104 executes a control program which is stored in the ROM 124 or the storage unit 128 and uses the RAM 126 as a working area. The control program will include software applications that include program code that may be executed by processor in order to perform various functionalities associated with receiving and analyzing data and controlling any and all aspects of the methods and hardware used to create the ion trap quantum computer system 100 discussed herein.

FIG. 2 depicts a schematic view of an ion trap 200 (also referred to as a Paul trap) for confining ions in the group 106 according to one embodiment. The confining potential is exerted by both static (DC) voltage and radio frequency (RF) voltages. A static (DC) voltage Vs is applied to end-cap electrodes 210 and 212 to confine the ions along the Z-axis (also referred to as an "axial direction" or a "longitudinal direction"). The ions in the group 106 are nearly evenly distributed in the axial direction due to the Coulomb interaction between the ions. In some embodiments, the ion trap 200 includes four hyperbolically-shaped electrodes 202, 204, 206, and 208 extending along the Z-axis.

During operation, a sinusoidal voltage $V_1$ (with an amplitude $V_{RF}/2$) is applied to an opposing pair of the electrodes 202, 204 and a sinusoidal voltage $V_2$ with a phase shift of 180° from the sinusoidal voltage $V_1$ (and the amplitude $V_{RF}/2$) is applied to the other opposing pair of the electrodes 206, 208 at a driving frequency $\omega_{RF}$, generating a quadrupole potential. In some embodiments, a sinusoidal voltage is only applied to one opposing pair of the electrodes 202, 204, and the other opposing pair 206, 208 is grounded. The quadrupole potential creates an effective confining force in the X-Y plane perpendicular to the Z-axis (also referred to as a "radial direction" or "transverse direction") for each of the trapped ions, which is proportional to a distance from a saddle point (i.e., a position in the axial direction (Z-direction)) at which the RF electric field vanishes. The motion in the radial direction (i.e., direction in the X-Y plane) of each ion is approximated as a harmonic oscillation (referred to as secular motion) with a restoring force towards the saddle point in the radial direction and can be modeled by spring constants $k_x$ and $k_y$, respectively, as is discussed in greater detail below. In some embodiments, the spring constants in the radial direction are modeled as equal when the quadrupole potential is symmetric in the radial direction. However, undesirably in some cases, the motion of the ions in the radial direction may be distorted due to some asymmetry in the physical trap configuration, a small DC patch potential due to inhomogeneity of a surface of the electrodes, or the like and due to these and other external sources of distortion the ions may lie off-center from the saddle points.

Trapped Ion Configuration and Quantum Bit Information

Figure 3B:
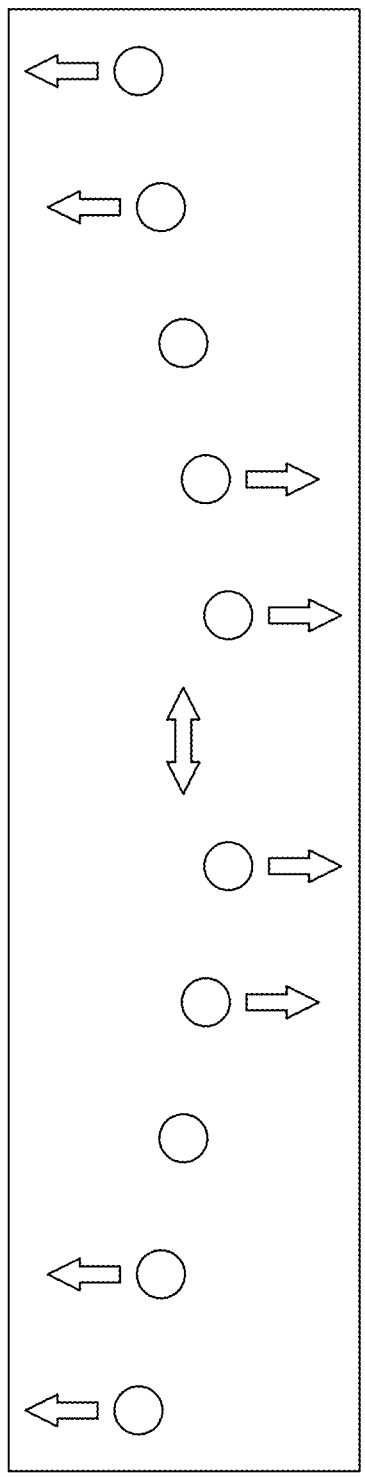
Figure 3C:
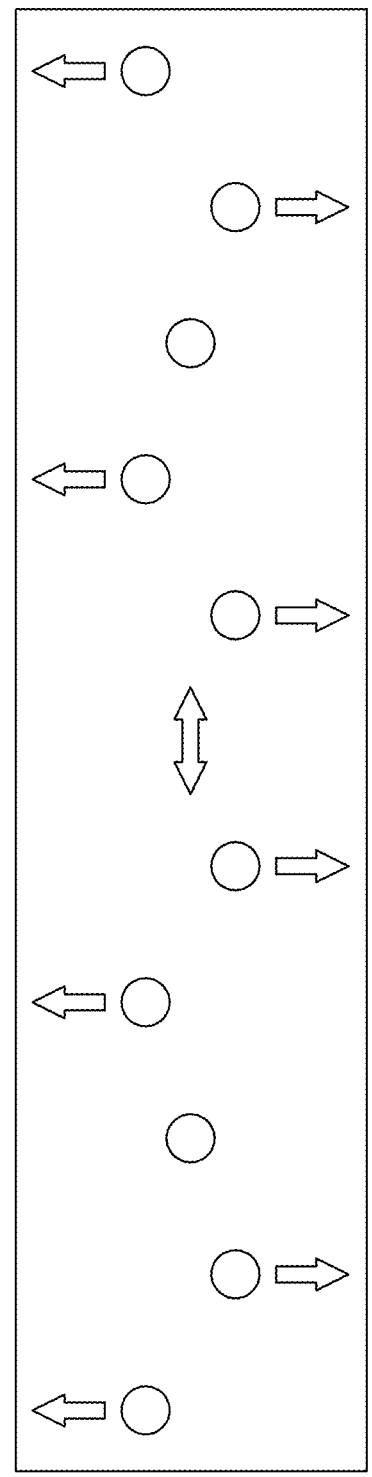

FIGS. 3A, 3B, and 3C depict a few schematic structures of collective transverse motional modes (also referred to simply as "motional mode structures") of a chain 102 of five trapped ions, for example. Here, the confining potential due to a static voltage Vs applied to the end-cap electrodes 210 and 212 is weaker compared to the confining potential in the radial direction. The collective motional modes of the chain 102 of trapped ions in the transverse direction are determined by the Coulomb interaction between the trapped ions combined with the confining potentials generated by the ion trap 200. The trapped ions undergo collective transversal motions (referred to as "collective transverse motional modes," "collective motional modes," or simply "motional modes"), where each mode has a distinct energy associated with it. A motional mode having the m-th lowest energy is hereinafter referred to as $|n\rangle_m$, where n denotes the number of motional quanta (in units of energy excitation, referred to as phonons) in the motional mode, and the number of motional modes in a given transverse direction is equal to the number of trapped ions N in the chain 102. FIGS. 3A-3C schematically illustrates examples of different types of collective transverse motional modes that may be experienced by five trapped ions that are positioned in a chain 102. FIG. 3A is a schematic view of a common motional mode $|n\rangle_N$ having the highest energy, where N is the number of trapped ions in the chain 102. In the common motional mode $|n\rangle_N$, all ions oscillate in phase in the transverse direction. FIG. 3B is a schematic view of a tilt motional mode $|n\rangle_{N-1}$ which has the second highest energy. In the tilt motional mode, ions on opposite ends move out of phase in the transverse direction (i.e., in opposite directions). FIG. 3C is a schematic view of a higher-order motional mode $|n\rangle_{N-3}$ which has a lower energy than that of the tilt motional mode $|n\rangle_{N-1}$, and in which the ions move in a more complicated mode pattern.

It should be noted that the particular configuration described above is just one among several possible examples of a trap for confining ions according to the present disclosure and does not limit the possible configurations, specifications, or the like of traps according to the present disclosure. For example, the geometry of the electrodes is not limited to the hyperbolic electrodes described above. In other examples, a trap that generates an effective electric field causing the motion of the ions in the radial direction as harmonic oscillations may be a multi-layer trap in which several electrode layers are stacked and an RF voltage is applied to two diagonally opposite electrodes, or a surface trap in which all electrodes are located in a single plane on a chip. Furthermore, a trap may be divided into multiple segments, adjacent pairs of which may be linked by shuttling one or more ions, or coupled by photon interconnects. A trap may also be an array of individual trapping regions arranged closely to each other on a micro-fabricated ion trap chip. In some embodiments, the quadrupole potential has a spatially varying DC component in addition to the RF component described above.

Figure 4:
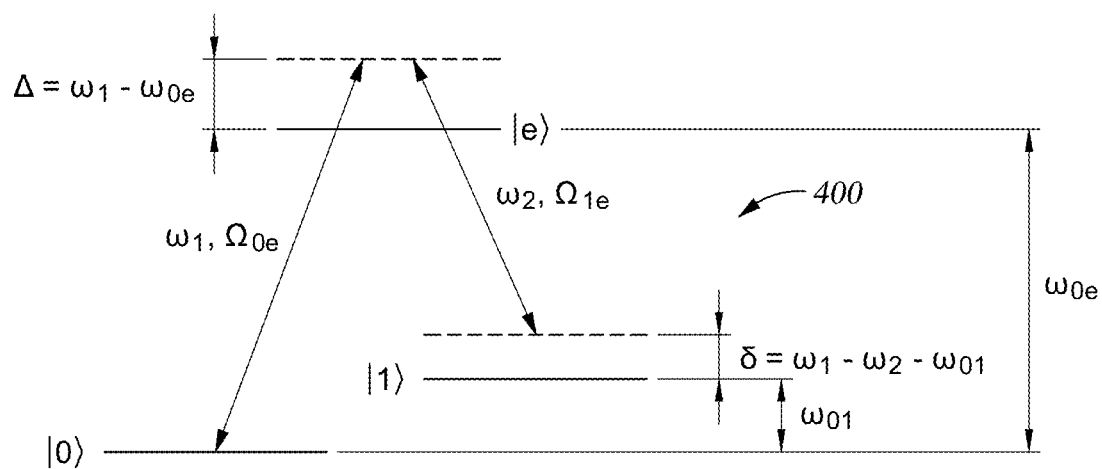
FIG. 4 depicts a schematic energy diagram of each ion in a chain of trapped ions according to one embodiment.

FIG. 4 depicts a schematic energy diagram 400 of each ion in the chain 102 of trapped ions according to one embodiment. In one example, each ion may be a positive Ytterbium ion, $^{171}Yb^+$, which has the $^2S_{1/2}$ hyperfine states (i.e., two electronic states) with an energy split corresponding to a frequency difference (referred to as a "carrier frequency") of $\omega_{01}/2\pi=12.642821$ GHz. A qubit is formed with the two hyperfine states, denoted as $|0\rangle$ and $|1\rangle$, where the hyperfine ground state (i.e., the lower energy state of the $^2S_{1/2}$ hyperfine states) is chosen to represent $|0\rangle$. Hereinafter, the terms "hyperfine states," "internal hyperfine states," and "qubits" may be interchangeably used to represent $|0\rangle$ and $|1\rangle$. Each ion may be cooled (i.e., kinetic energy of the ion may be reduced) to near the motional ground state $|0\rangle_m$ for any motional mode m with no phonon excitation (i.e., $n_{ph}=0$) by known laser cooling methods, such as Doppler cooling or resolved sideband cooling, and then the qubit state prepared in the hyperfine ground state $|0\rangle$ by optical pumping. Here, $|0\rangle$ represents the individual qubit state of a trapped ion whereas $|0\rangle_m$ with the subscript m denotes the motional ground state for a motional mode m of a group 106 of trapped ions.

An individual qubit state of each trapped ion may be manipulated by, for example, a mode-locked laser at 355 nanometers (nm) via the excited $^2P_{1/2}$ level (denoted as $|e\rangle$). As shown in FIG. 4, a laser beam from the laser may be split into a pair of non-copropagating laser beams (a first laser beam with frequency $\omega_1$ and a second laser beam with frequency $\omega_2$) in the Raman configuration, and detuned by a one-photon transition detuning frequency $\Delta=\omega_1-\omega_e$ with respect to the transition frequency $\omega_{0e}$ between $|0\rangle$ and $|e\rangle$, as illustrated in FIG. 4. A two-photon transition detuning frequency $\delta$ includes adjusting the amount of energy that is provided to the trapped ion by the first and second laser beams, which when combined is used to cause the trapped ion to transfer between the hyperfine states $|0\rangle$ and $|1\rangle$. When the one-photon transition detuning frequency $\Delta$ is much larger than a two-photon transition detuning frequency (also referred to simply as "detuning frequency") $\delta=\omega_1-\omega_2-\omega_{01}$ (hereinafter denoted as $\pm\mu$, $\mu$ being a positive value), single-photon Rabi frequencies $\Omega_{0e}(t)$ and $\Omega_{1e}(t)$ (which are time-dependent, and are determined by amplitudes and phases of the first and second laser beams), at which Rabi flopping between states $|0\rangle$ and $|e\rangle$ and between states $|1\rangle$ and $|e\rangle$ respectively occur, and a spontaneous emission rate from the excited state $|e\rangle$, Rabi flopping between the two hyperfine states $|0\rangle$ and $|1\rangle$ (referred to as a "carrier transition") is induced at the two-photon Rabi frequency $\Omega(t)$. The two-photon Rabi frequency $\Omega(t)$ has an intensity (i.e., absolute value of amplitude) that is proportional to $\Omega_{0e}\Omega_{1e}/2\Delta$, where $\Omega_{0e}$ and $\Omega_{1e}$ are the single-photon Rabi frequencies due to the first and second laser beams, respectively. Hereinafter, this set of counter-propagating laser beams in the Raman configuration to manipulate internal hyperfine states of qubits (qubit states) may be referred to as a "composite pulse" or simply as a "pulse," and the resulting time-dependent pattern of the two-photon Rabi frequency $\Omega(t)$ may be referred to as an "amplitude" of a pulse or simply as a "pulse," which are illustrated and further described in conjunction with FIGS. 7A and 8A below. The detuning frequency $\delta=\omega_1-\omega_2-\omega_{01}$ may be referred to as detuning frequency of the composite pulse or detuning frequency of the pulse. The amplitude of the two-photon Rabi frequency $\Omega(t)$, which is determined by amplitudes of the first and second laser beams, may be referred to as an "amplitude" of the composite pulse.

It should be noted that the particular atomic species used in the discussion provided herein is just one example of atomic species which has stable and well-defined two-level energy structures when ionized and an excited state that is optically accessible, and thus is not intended to limit the possible configurations, specifications, or the like of an ion trap quantum computer according to the present disclosure. For example, other ion species include alkaline earth metal ions ($Be^+$, $Ca^+$, $Sr^+$, $Mg^+$, and $Ba^+$) or transition metal ions ($Zn^+$, $Hg^+$, $Cd^+$).

Figure 5:
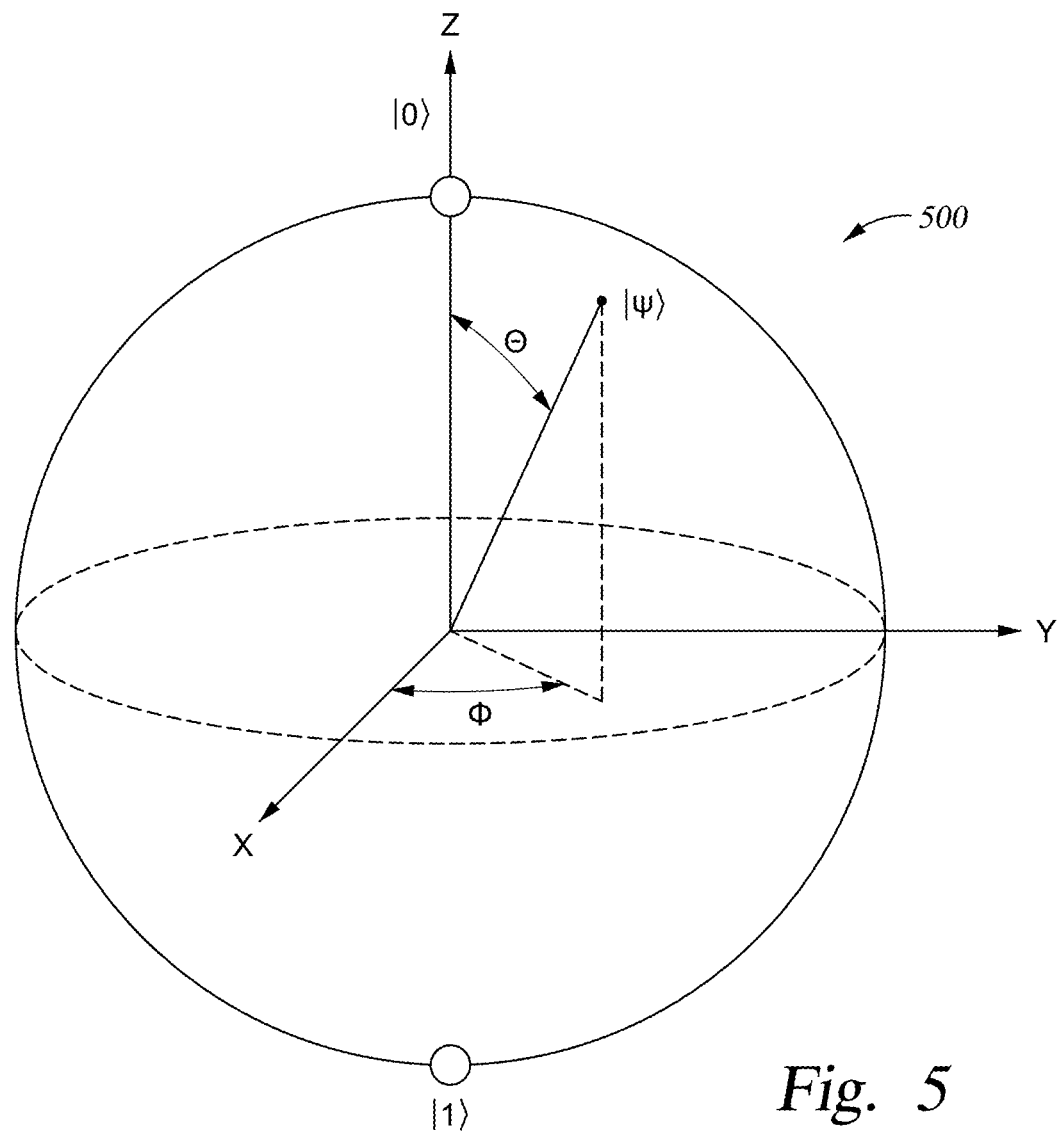
FIG. 5 depicts a qubit state of an ion represented as a point on a surface of the Bloch sphere.

FIG. 5 is provided to help visualize a qubit state of an ion is represented as a point on a surface of the Bloch sphere 500 with an azimuthal angle $\phi$ and a polar angle $\theta$. Application of the composite pulse as described above, causes Rabi flopping between the qubit state $|0\rangle$ (represented as the north pole of the Bloch sphere) and $|1\rangle$ (the south pole of the Bloch sphere) to occur. Adjusting time duration and amplitudes of the composite pulse flips the qubit state from $|0\rangle$ to $|1\rangle$ (i.e., from the north pole to the south pole of the Bloch sphere), or the qubit state from $|1\rangle$ to $|0\rangle$ (i.e., from the south pole to the north pole of the Bloch sphere). This application of the composite pulse is referred to as a "$\pi$-pulse". Further, by adjusting time duration and amplitudes of the composite pulse, the qubit state $|0\rangle$ may be transformed to a superposition state $|0\rangle+|1\rangle$, where the two qubit states $|0\rangle$ and $|1\rangle$ are added and equally-weighted in-phase (a normalization factor of the superposition state is omitted hereinafter without loss of generality) and the qubit state $|1\rangle$ to a superposition state $|0\rangle-|1\rangle$, where the two qubit states $|0\rangle$ and $|1\rangle$ are added equally-weighted but out of phase. This application of the composite pulse is referred to as a "$\pi/2$-pulse". More generally, a superposition of the two qubits states $|0\rangle$ and $|1\rangle$ that are added and equally-weighted is represented by a point that lies on the equator of the Bloch sphere. For example, the superposition states $|0\rangle\pm|1\rangle$ correspond to points on the equator with the azimuthal angle $\phi$ being zero and $\pi$, respectively. The superposition states that correspond to points on the equator with the azimuthal angle $\phi$ are denoted as $|0\rangle+e^{i\phi}|1\rangle$ (e.g., $|0\rangle\pm i|1\rangle$ for $\phi=\pm\pi/2$). Transformation between two points on the equator (i.e., a rotation about the Z-axis on the Bloch sphere) can be implemented by shifting phases of the composite pulse.

Figure 6A:
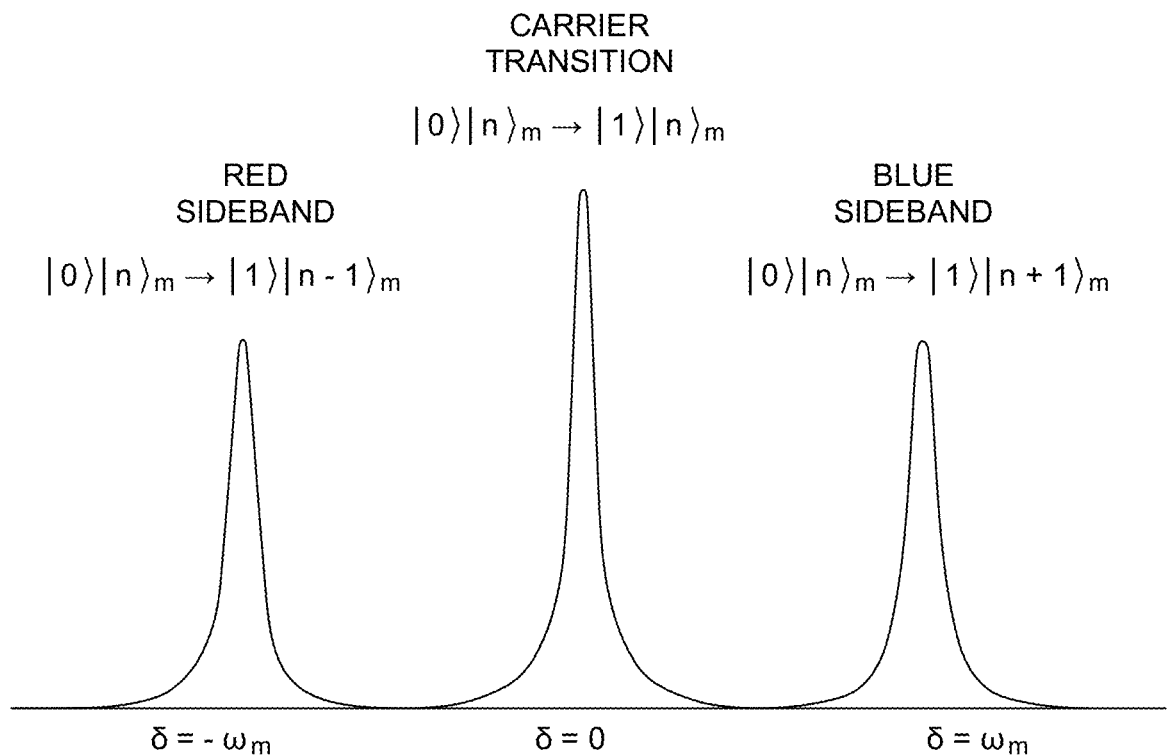
FIGS. 6A and 6B depict schematic views of motional sideband spectrum of each ion and a motional mode according to one embodiment.
Figure 6B:
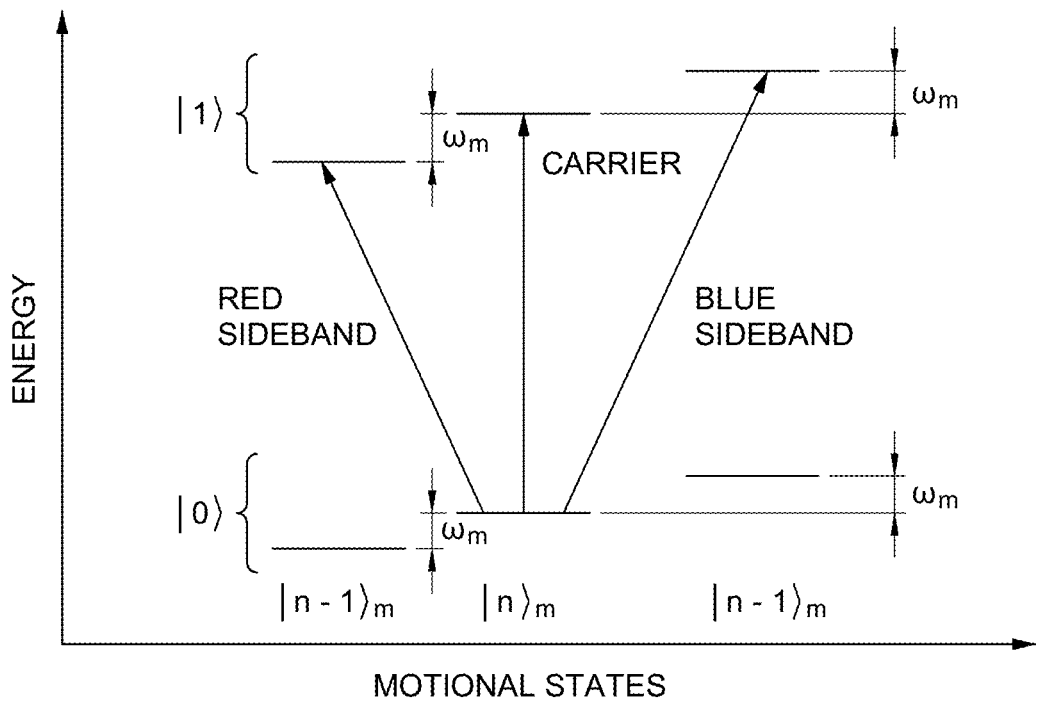

In an ion trap quantum computer, the motional modes may act as a data bus to mediate entanglement between two qubits and this entanglement is used to perform an XX gate operation. That is, each of the two qubits is entangled with the motional modes, and then the entanglement is transferred to an entanglement between the two qubits by using motional sideband excitations, as described below. FIGS. 6A and 6B schematically depict views of a motional sideband spectrum for an ion in the group 106 in a motional mode $|n_{ph}\rangle_M$ having frequency $\omega_m$ according to one embodiment. As illustrated in FIG. 6B, when the detuning frequency of the composite pulse is zero (i.e., a frequency difference between the first and second laser beams is tuned to the carrier frequency, $\delta=\omega_1-\omega_2-\omega_{01}=0$), simple Rabi flopping between the qubit states $|0\rangle$ and $|1\rangle$ (carrier transition) occurs. When the detuning frequency of the composite pulse is positive (i.e., the frequency difference between the first and second laser beams is tuned higher than the carrier frequency, $\delta=\omega_1-\omega_2-\omega_{01}=\mu>0$, referred to as a blue sideband), Rabi flopping between combined qubit-motional states $|0\rangle|n_{ph}\rangle_m$ and $|1\rangle|n_{ph}+1\rangle_m$ occurs (i.e., a transition from the m-th motional mode with n-phonon excitations denoted by $|n_{ph}\rangle_m$ to the m-th motional mode with ($n_{ph}+1$)-phonon excitations denoted by $|n_{ph}+1\rangle_m$ occurs when the qubit state $|0\rangle$ flips to $|1\rangle$). When the detuning frequency of the composite pulse is negative (i.e., the frequency difference between the first and second laser beams is tuned lower than the carrier frequency by the frequency $\omega_m$ of the motional mode $|n_{ph}\rangle_m$, $\delta=\omega_1-\omega_2-\omega_{01}=-\mu<0$, referred to as a red sideband), Rabi flopping between combined qubit-motional states $|0\rangle|n_{ph}\rangle_m$ and $|1\rangle|n_{ph}-1\rangle_m$ occurs (i.e., a transition from the motional mode $|n_{ph}\rangle_m$ to the motional mode $|n_{ph}-1\rangle_m$ with one less phonon excitations occurs when the qubit state $|0\rangle$ flips to $|1\rangle$). A $\pi/2$-pulse on the blue sideband applied to a qubit transforms the combined qubit-motional state $|0\rangle|n_{ph}\rangle_m$ into a superposition of $|0\rangle|n_{ph}\rangle_m$ and $|1\rangle|n_{ph}+1\rangle_m$. A $\pi/2$-pulse on the red sideband applied to a qubit transforms the combined qubit-motional $|0\rangle|n_{ph}\rangle_m$ into a superposition of $|1\rangle|n_{ph}\rangle_m$ and $|1\rangle|n_{ph}-1\rangle_m$. When the two-photon Rabi frequency $\Omega(t)$ is smaller as compared to the detuning frequency $\delta=\omega_1-\omega_2-\omega_{01}=\pm\mu$, the blue sideband transition or the red sideband transition may be selectively driven. Thus, qubit states of a qubit can be entangled with a desired motional mode by applying the right type of pulse, such as a $\pi/2$-pulse, which can be subsequently entangled with another qubit, leading to an entanglement between the two qubits that is needed to perform an XX-gate operation in an ion trap quantum computer.

By controlling and/or directing transformations of the combined qubit-motional states as described above, an XX-gate operation may be performed on two qubits (i-th and j-th qubits). In general, the XX-gate operation (with maximal entanglement) respectively transforms two-qubit states $|0\rangle_i|0\rangle_j$, $|0\rangle_i|1\rangle_j$, $|1\rangle_i|0\rangle_j$, and $|1\rangle_i|1\rangle_j$ as follows:

$|0\rangle_i|0\rangle_j \rightarrow |0\rangle_i|0\rangle_j - i|1\rangle_i|1\rangle_j$ $|0\rangle_i|1\rangle_j \rightarrow |0\rangle_i|1\rangle_j - i|1\rangle_i|0\rangle_j$ $|1\rangle_i|0\rangle_j \rightarrow -i|0\rangle_i|1\rangle_j + i|1\rangle_i|0\rangle_j$ $|1\rangle_i|1\rangle_j \rightarrow -i|0\rangle_i|0\rangle_j + i|1\rangle_i|1\rangle_j$.

For example, when the two qubits (i-th and j-th qubits) are both initially in the hyperfine ground state $|0\rangle$ (denoted as $|0\rangle_i|0\rangle_j$) and subsequently a $\pi/2$-pulse on the blue sideband is applied to the i-th qubit, the combined state of the i-th qubit and the motional mode $|0\rangle_i|n_{ph}\rangle_m$ is transformed into a superposition of $|0\rangle_i|n_{ph}\rangle_m$ and $|1\rangle_i|n_{ph}+1\rangle_m$, and thus the combined state of the two qubits and the motional mode is transformed into a superposition of $|0\rangle_i|0\rangle_j|n_{ph}\rangle_m$ and $|1\rangle_i|0\rangle_j|n_{ph}+1\rangle_m$. When a $\pi/2$-pulse on the red sideband is applied to the j-th qubit, the combined state of the j-th qubit and the motional mode $|0\rangle_j|n_{ph}\rangle_m$ is transformed to a superposition of $|0\rangle_j|n_{ph}\rangle_m$ and $|1\rangle_j|n_{ph}-1\rangle_m$ and the combined state $|0\rangle_j|n_{ph}+1\rangle_m$ is transformed into a superposition of $|0\rangle_j|n_{ph}+1\rangle_m$ and $|1\rangle_j|n_{ph}\rangle_m$.

Thus, applications of a $r\pi/2$-pulse on the blue sideband on the i-th qubit and a $\pi/2$-pulse on the red sideband on the j-th qubit may transform the combined state of the two qubits and the motional mode $|0\rangle_i|0\rangle_j|n_{ph}\rangle_m$ into a superposition of $|0\rangle_i|0\rangle_j|n_{ph}\rangle_m$ and $|1\rangle_i|1\rangle_j|n_{ph}\rangle_m$, the two qubits now being in an entangled state. For those of ordinary skill in the art, it should be clear that two-qubit states that are entangled with motional mode having a different number of phonon excitations from the initial number of phonon excitations $n_{ph}$ (i.e., $|1\rangle_i|0\rangle_j|n_{ph}+1\rangle_m$ and $|0\rangle_i|1\rangle_j|n_{ph}-1\rangle_m$) can be removed by a sufficiently complex pulse sequence, and thus the combined state of the two qubits and the motional mode after the XX-gate operation may be considered disentangled as the initial number of phonon excitations $n_{ph}$ in the m-th motional mode stays unchanged at the end of the XX-gate operation. Thus, qubit states before and after the XX-gate operation will be described below generally without including the motional modes.

More generally, the combined state of i-th and j-th qubits transformed by the application of the composite pulse on the sidebands for duration $\tau$ (referred to as a "gate duration") can be described in terms of an entangling interaction $\chi_{i,j}(\tau)$ as follows:

$|0\rangle_i|0\rangle_j \rightarrow \cos(\chi_{i,j}(\tau))|0\rangle_i|0\rangle_j - i\sin(\chi_{i,j}(\tau))|1\rangle_i|1\rangle_j$ $|0\rangle_i|1\rangle_j \rightarrow \cos(\chi_{i,j}(\tau))|0\rangle_i|1\rangle_j - i\sin(\chi_{i,j}(\tau))|1\rangle_i|0\rangle_j$ $|1\rangle_i|0\rangle_j \rightarrow -i\sin(\chi_{i,j}(\tau))|0\rangle_i|1\rangle_j + \cos(\chi_{i,j}(\tau))|1\rangle_i|0\rangle_j$ $|1\rangle_i|1\rangle_j \rightarrow -i\sin(\chi_{i,j}(\tau))|0\rangle_i|0\rangle_j + \cos(\chi_{i,j}(\tau))|1\rangle_i|1\rangle_j$ where, $$\chi_{i,j}(\tau) = 2\sum_m \eta_{i,m}\eta_{j,m}\int_0^\tau\int_0^{t'}\Omega_i(t)\Omega_j(t')\sin(\mu t)\sin(\mu t')\sin[\omega_m(t'-t)]\,dt\,dt',$$

and $\eta_{i,m}$ is the Lamb-Dicke parameter that quantifies the coupling strength between the i-th ion and the m-th motional mode having the frequency $\omega_m$. In some embodiments, the pulse sequences $\Omega_i(t)$ (pulse sequence delivered to the i-th ion) and $\Omega_j(t)$ (pulse sequence delivered to the and j-th ion) for the i-th and the j-th ions, respectively, are adjusted as control parameters. The control parameters, which include pulse sequences $\Omega_i(t)$ and $\Omega_j(t)$, can be adjusted to assure a non-zero tunable entanglement of the i-th and the j-th ions to perform desired transformations of the combined state of i-th and j-th qubits. One of the conditions that the control parameters, the pulse sequences $\Omega_i(t)$ and $\Omega_j(t)$, must satisfy is that $0<\chi_{i,j}(\tau)\leq\pi/4$, which implies a non-zero entangling interaction. The transformations of the combined state of i-th and j-th qubits described above corresponds to the XX-gate operation when $\chi_{i,j}(\tau)=\pi/4$.

The control parameters, the pulse sequences $\Omega_i(t)$ and $\Omega_j(t)$, must also satisfy conditions that the trapped ions that are displaced from their initial positions as the motional modes are excited by the delivery of the pulse sequences $\Omega_i(t)$ and $\Omega_j(t)$ to the trapped ions return to the initial positions. The l-th ion in a superposition state $|0\rangle\pm|1\rangle$ (l=i,j) is displaced due to the excitation of the m-th motional mode during the gate duration $\tau$ and follows the trajectories $\pm\alpha_{l,m}(\tau)$ in phase space (position and momentum) of the m-th motional mode, where $\alpha_{l,m}(\tau)=i\eta_{l,m}\int_0^\tau \Omega_l(t)\sin(\mu t)e^{-i\omega_m t}\,dt$. Thus, for the chain 102 of N trapped ions, the condition $\alpha_{l,m}(\tau)=0$ (l=i, j) (referred also as "closing of phase space") must be imposed for all the N motional modes, in addition to the condition $0<\chi_{i,j}(\tau)\leq\pi/4$. These conditions may be satisfied by evenly partitioning the gate duration $\tau$ into $N_s$ (where $1<N_s$) segments (s=1, 2, ..., $N_s$)

of equal duration and varying the intensity of the pulse sequence $\Omega_i(t)$ in each segment. That is, the pulse sequence $\Omega_i(t)$ is divided into $N_s$ pulse segments, each having an intensity $\Omega_s$ and a duration. The intensities $\Omega_s$ (s=1, 2, ..., N) of the pulse segments are then determined such that the closing of phase spaces ($\alpha_{l,m}(\tau)=0$) are satisfied to a high numeric precision and the non-zero entangling interaction ($0<|\chi_{i,j}(\tau)|\leq\pi/4$) are satisfied.

Entangling Gate Operations

Figure 7A:
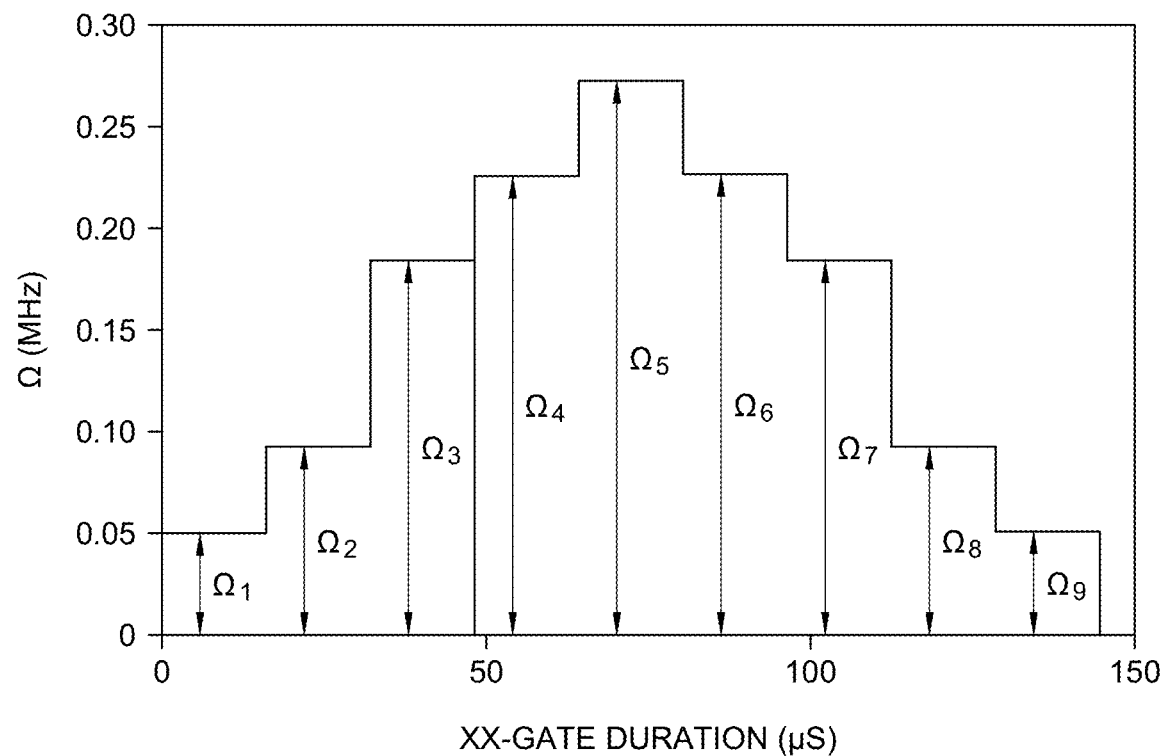
FIG. 7A depicts a segmented laser pulse sequence $\Omega(t)$ of stepwise laser pulse segments for performing an XX-gate operation for a chain of seven trapped ions.

The non-zero entangling interaction between two qubits described above can be used to perform an XX-gate operation. The XX-gate operation (gate XX) along with single-qubit operation (the gate R) forms a universal gate set {R, XX} that can be used to build a quantum computer that is configured to perform desired computational processes. FIG. 7A depicts a segmented pulse sequence $\Omega(t)$ for the gate duration $\tau$ (e.g., ~145 µs) that may initially be used to cause an XX-gate operation on second and fourth ions of a chain 102 of seven trapped ions. In the example depicted in FIG. 7A, the pulse sequence $\Omega(t)$ for all seven trapped ions in the chain 102 is the same and is divided into nine stepwise pulse segments, each having a different intensity $\Omega_s$ (s=1, 2, ..., 9). In this example, the intensities $\Omega_s(t)$ (s=1, 2, ..., 9) of the pulse segments are determined such that all of the conditions $0<\chi_{i,j}(\tau)\leq\pi/4$ and $\alpha_{l,m}(\tau)=0$ (l=i, j) are satisfied. The segmented pulse sequence $\Omega(t)$ may be generated by combining the pulse segments having the determined intensities $\Omega_s(t)$ (s=1, 2, ..., 9).

Figure 7B:
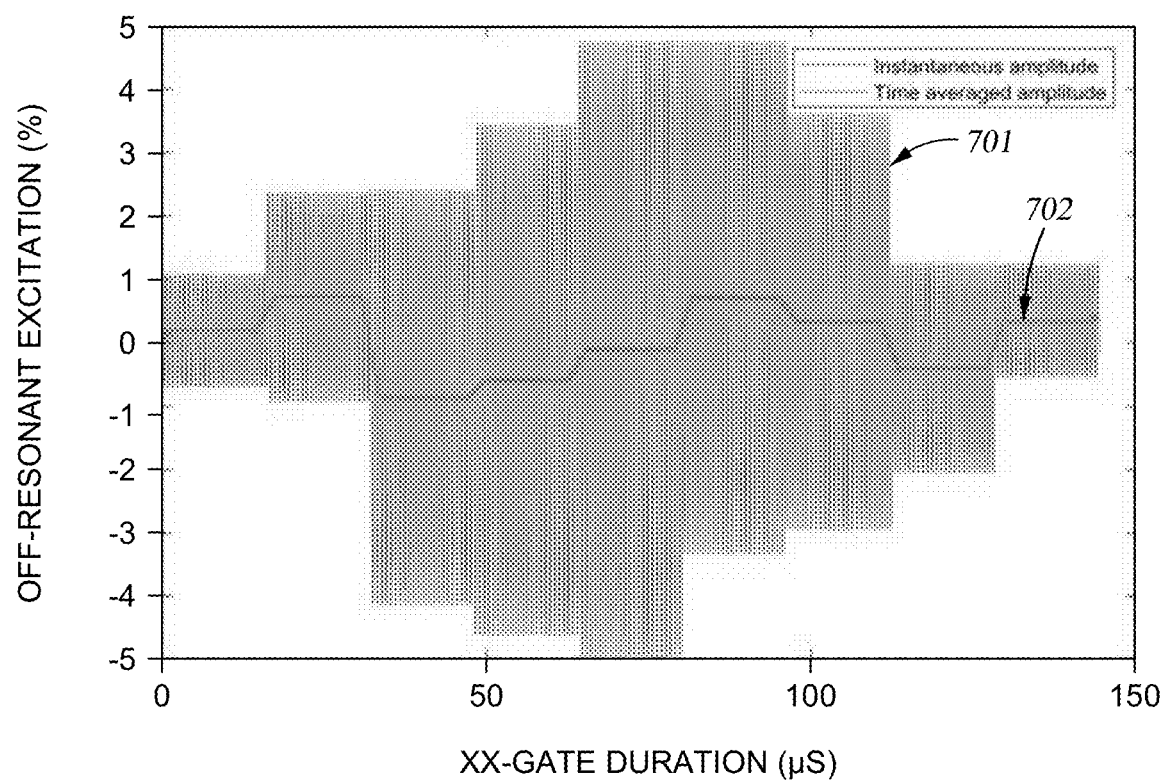
FIG. 7B depicts simulated results of instantaneous and time-averaged populations of an off-resonant carrier excitation during an XX-gate operation.

FIG. 7B depicts simulated results of instantaneous and time-averaged populations of an off-resonant carrier excitation of the second and fourth ions of the chain 102 of seven trapped ions from the qubit state |0⟩ to |1⟩ during a XX-gate operation performed by the segmented pulse sequence $\Omega(t)$ of nine stepwise pulse segments depicted in FIG. 7A, based on a value of the detuning frequency µ chosen to be between the frequencies $\omega_3$ and $\omega_4$ of the third and fourth motional modes. In FIG. 7B, the off-resonant carrier excitation 701 of the second and fourth ions undesirably varies around a non-zero value and the time-averaged off-resonant carrier excitation 702 does not return to zero during different stages of the pulse sequence and at the end of the XX-gate operation.

Figure 8A:
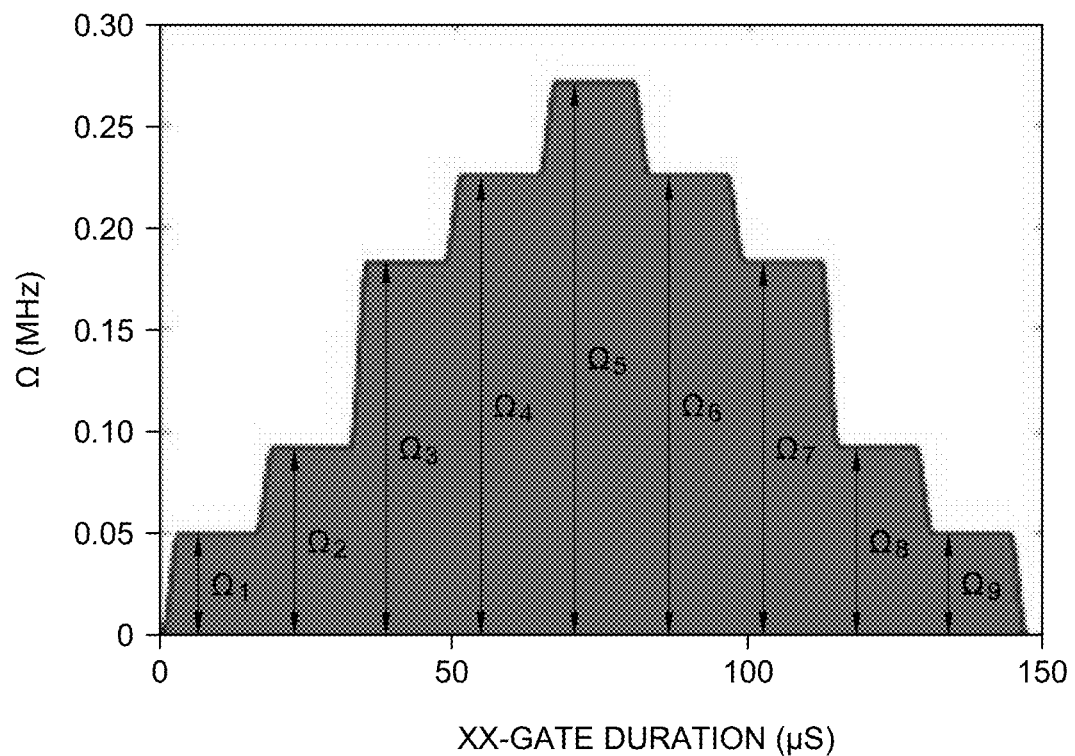
FIG. 8A depicts a segmented laser pulse sequence $\Omega(t)$ of laser pulses with gradual ramps for performing an XX-gate operation for a chain of seven trapped ions according to one embodiment.

Alternately, FIG. 8A depicts an improved segmented pulse sequence $\Omega(t)$ over the gate duration $\tau$ that is created and applied after performing the optimization steps described below to perform an XX gate operation for second and fourth ions of a chain 102 of seven trapped ions according to embodiments of the disclosure described herein. In the example depicted in FIG. 8A, the same pulse sequence $\Omega(t)$ is applied on second and fourth ions in the chain 102 and is divided into nine pulse segments. In FIG. 8A, each pulse segment has an intensity $\Omega_s$ (s=1, 2, ..., 9) and has a pulse shape with ramps formed using a spline at a start and an end of the pulse segment in the form of sine-squared functions, for example. That is, the ramp intensity between adjacent pulse segments having intensities $\Omega_s$ (starting at a time $t_S$) and $\Omega_{S+1}$ (starting at a time $t_S+\tau/(2N_s+1)$) is given by $(\Omega_{S+1}-\Omega_S)\times\sin^2(\pi^{(t-t_S)}/2t_R)$, where $t_R$ is a ramp duration. The intensities $\Omega_s(t)$ (s=1, 2, ..., 9) of the stepwise pulse segments are determined such that all the conditions $0<\chi_{i,j}(\tau)\leq\pi/4$ and $\alpha_{l,m}(\tau)=0$ (l=i, j) are satisfied. The ramped, segmented pulse sequence $\Omega(t)$ may be generated by combining the pulse segments having the determined intensities with ramps at the start and the end thereof.

Figure 8B:
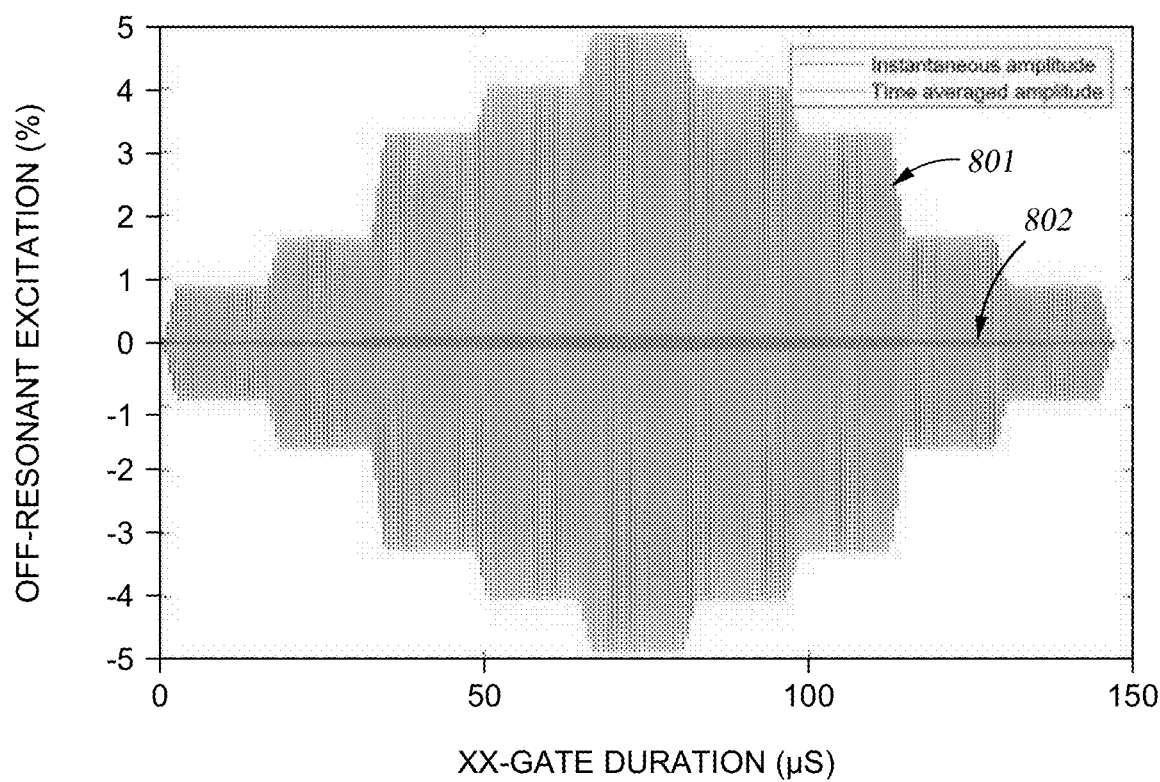
FIG. 8B depicts improved results of instantaneous and time-averaged populations of an off-resonant carrier excitation during an XX-gate operation.
Figure 8C:
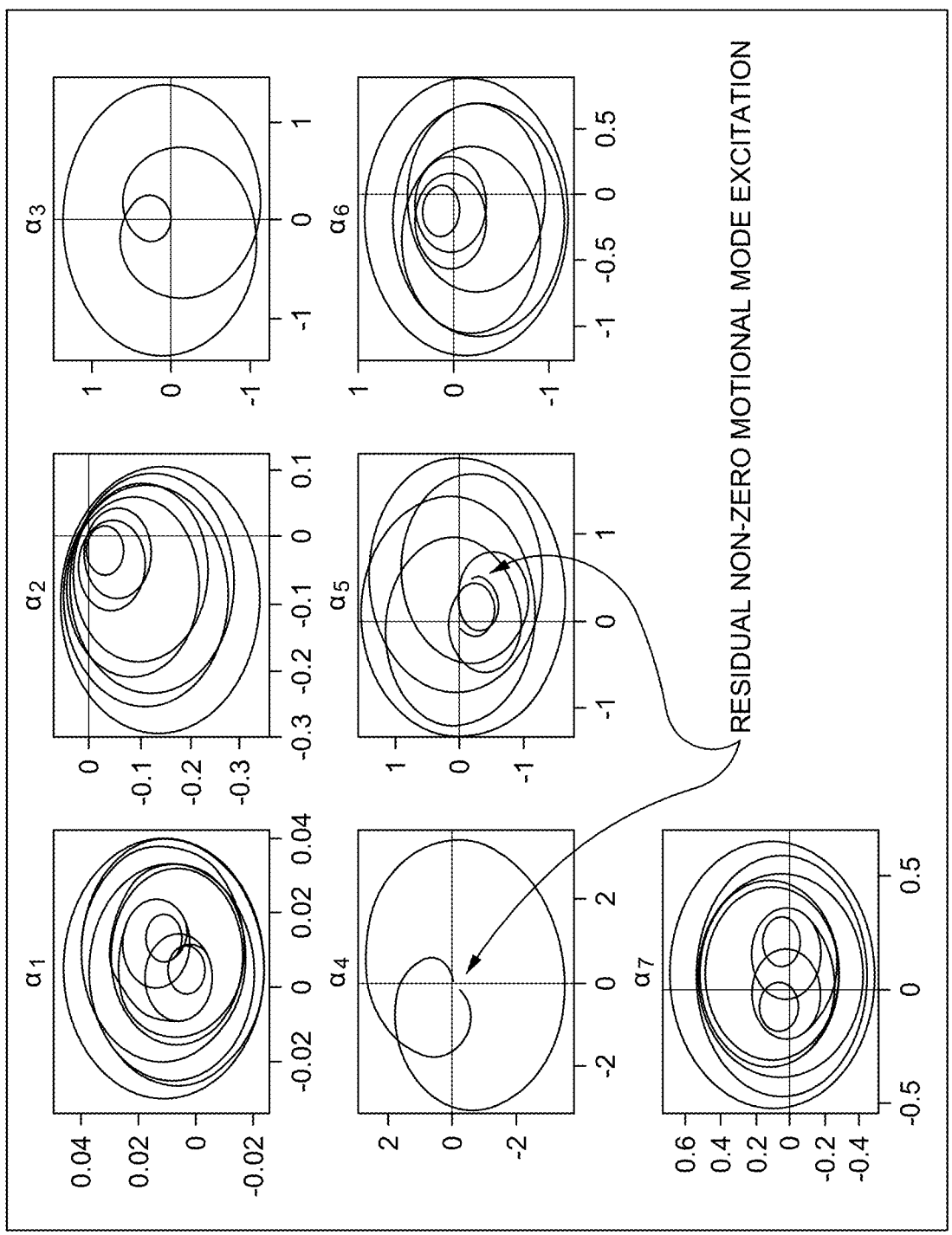
FIG. 8C depicts phase space trajectories during an XX-gate operation.

FIG. 8B depicts improved results of instantaneous and time-averaged populations of an off-resonant carrier excitation of second and fourth ions of the chain 102 between qubit state |0⟩ to |1⟩ during the XX-gate operation performed by the improved segmented pulse sequence $\Omega(t)$ depicted in FIG. 8A. In FIG. 8B, the off-resonant carrier excitation 801 is made to oscillate about zero, which ensures that the time-averaged off-resonant carrier excitation 802 of the second and fourth ions of the chain 102 stays close to zero throughout and returns to zero at the end of the XX-gate operation. In FIG. 8C, as a result of the delivery of the improved segmented pulse sequence $\Omega(t)$ illustrated in FIG. 8A, the phase space trajectories $\alpha_{l,m}(\tau)$ (in arbitrary unit) of the m-th motional mode (m=1, 2, ..., 7) are formed, which are graphically depicted therein. Each of the phase space trajectories $\alpha_1$-$\alpha_7$ shown in FIG. 8C, separately illustrate the trajectories of each of the seven motional modes of the chain 102 of seven trapped ions, in the phase space (i.e., position in the horizontal axis and momentum in the vertical axis), where the origin illustrates the initial positions of the ions before the pulse sequence $\Omega(t)$ has been applied. As shown in FIG. 8C, the phase space trajectories $\alpha_{l,m}(\tau)$ of some of the motional modes, such as the phase space trajectories $\alpha_4$ and $\alpha_5$, do not return to the origins at the end of the XX-gate operation, causing displacement of the ions. This is because the original segmented pulse sequence $\Omega(t)$ as shown in FIG. 7A is slightly modified due to the addition of the splines as shown in FIG. 8A and hence does not close all phase space trajectories.

Figure 8D:
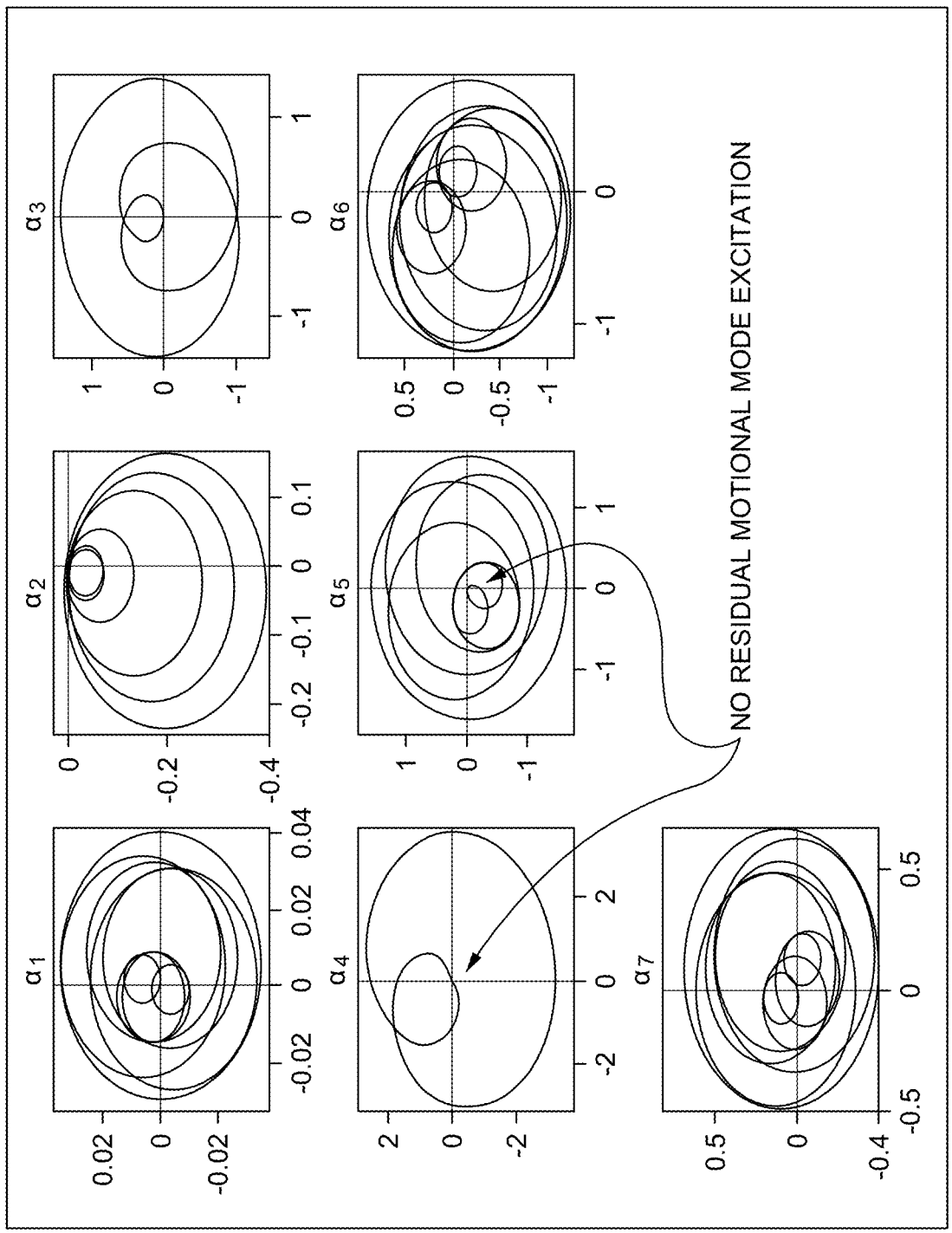
FIG. 8D depicts phase space trajectories during an XX-gate operation.

It is thus useful to include the effect of splines while solving for optimized segmented pulse sequence $\Omega(t)$ such that phase space trajectories of all motional mode return to the origins at the end of the XX gate operation. In FIG. 8D depicts phase space trajectories $\alpha_{l,m}(T)$ (in arbitrary unit) in phase space of the m-th motional mode (m=1, 2 ..., 7) due to this further optimized segmented pulse sequence $\Omega(t)$ (not shown). In FIG. 8D, the phase space trajectories $\alpha_{l,m}(\tau)$ return to the origins at the end of the XX-gate operation (i.e., there is zero residual excitation of the motional modes at the end of the XX-gate operation). The improved segmented pulse sequence $\Omega(t)$ therefore results in the reduction of the residual off-resonant carrier excitation as shown in FIG. 8B due to the use of the ramps, while maintaining residual motional excitation at the end of the gate minimum as shown in FIG. 8D, thereby improving the fidelity of the XX-gate operation.

Figure 9:
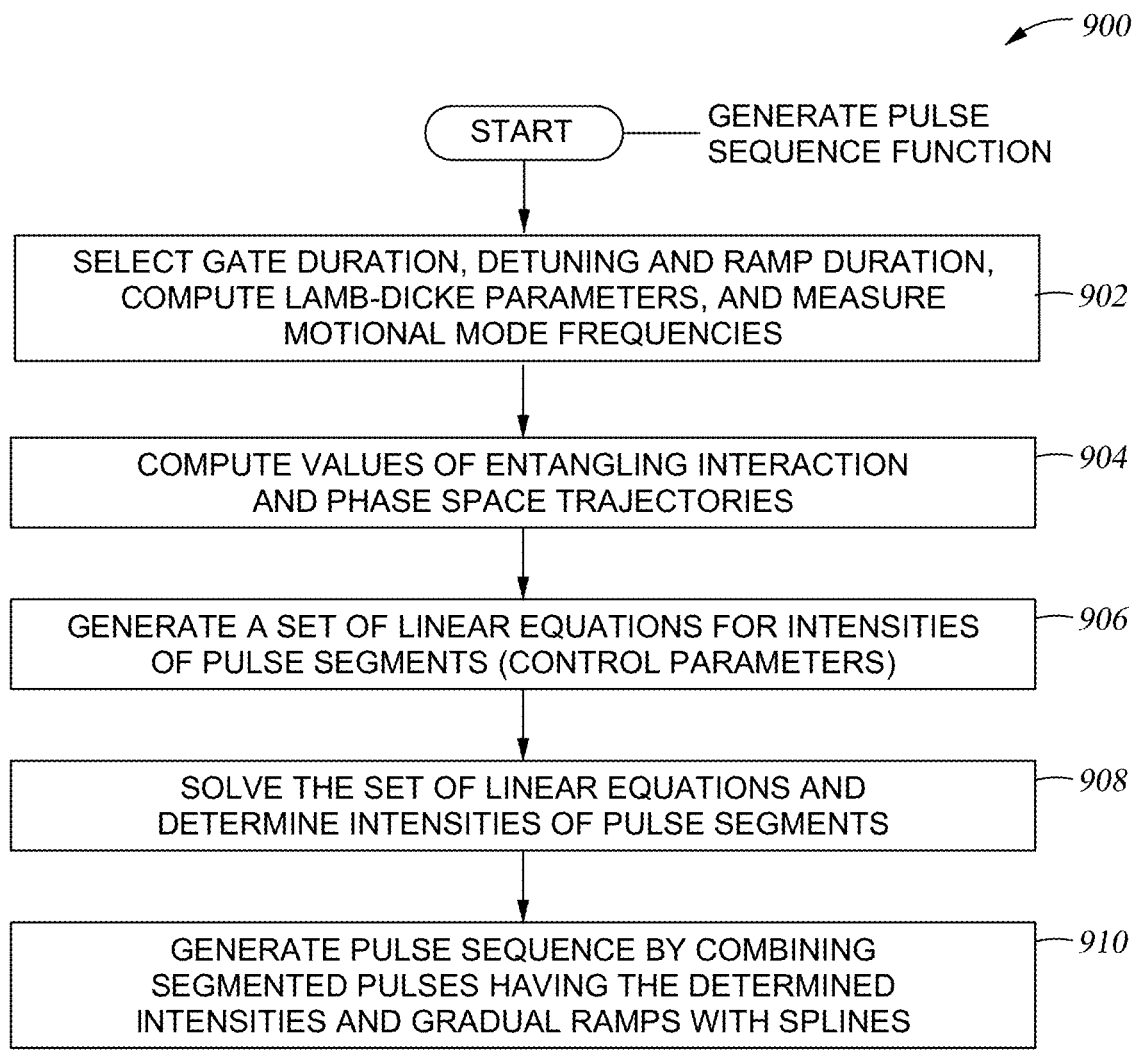
FIG. 9 depicts a flowchart illustrating a method to generate an improved or optimized segmented laser pulse sequence $\Omega(t)$ for performing an XX-gate operation according to one embodiment.

FIG. 9 depicts a flowchart illustrating a method 900 that includes various steps performed that are used to generate an improved or optimized segmented pulse sequence $\Omega(t)$ to perform a XX-gate operation on two qubits (i-th and j-th qubits) of a chain 102 of N trapped ions according to one embodiment.

In block 902, values for the gate duration $\tau$, the detuning frequency µ, the ramp duration $t_R$, and Lamb-Dicke parameter for the i-th ion and m-th motional mode $\eta_{i,m}$ are selected as input parameters. The gate duration gate duration $\tau$ and the detuning frequency µ are chosen as described below in conjunction with FIG. 15. The Lamb-Dicke parameters are computed as described below in conjunction with FIG. 11. The motional mode frequencies ($\omega_m$, m=0, 1, ..., N−1) are measured directly from the ion trap quantum computer system 100 whereas the motional mode structures are computed as described in conjunction with FIGS. 10, 11, and 12A-12C. The Lamb-Dicke parameters $\eta_{i,m}$ are determined by the motional mode structures, photon momentum of the laser beams that drive the motional sideband transitions, the ion mass, and the transverse motional mode frequency $\omega_m$.

The segmented pulse sequence $\Omega(t)$ includes $N_S$ pulse segments, where $N_S$ is iteratively chosen based on the number of ions N for a desired gate duration $\tau$ and required overall intensity of the entangling interaction to perform the XX-gate operation. In one example described herein, each pulse segment of the pulse sequence $\Omega(t)$ has an equal length $\tau_S$ (=$\tau/N_S$) and a intensity $\Omega_s$ (s=1, 2, ..., $N_s$) with ramps at a start and an end thereof using splines with the ramp duration $t_R$. However, in some embodiments, pulse segments of the segmented pulse sequence $\Omega(t)$ may have varying lengths in time.

In block 904, a value of the entangling interaction $\chi_{i,j}(\tau)$ for i-th and j-th qubits and the values of the phase space trajectories $\alpha_{l,m}(\tau)$ for l-th ion (l=i, j) and the m-th motional mode (m=0, 1, ..., N−1) are computed based on the values for the gate duration $\tau$, the detuning frequency $\mu$, the ramp duration $t_R$, the frequency $\omega_m$ of the m-th motional mode, the number of pulse segments $N_S$, and the Lamb-Dicke parameters $\eta_{i,m}$, $\eta_{j,m}$ selected as input parameters in block 902. The value of the entangling interaction is, $$\chi_{i,j}(\tau) = 2 \sum_m \eta_{i,m} \eta_{j,m} \int_0^\tau \int_0^{t'} \Omega_i(t) \Omega_j(t') \sin(\mu t) \sin(\mu t') \sin[\omega_m(t'-t)] \, dt \, dt'$$

for i-th and j-th qubits, and the values of the phase space trajectories are $$\alpha_{l,m}(\eta) = i\eta_{l,m} \int_0^\tau \Omega_l(t) \sin(\mu t) e^{-i\omega_m t} dt$$

for l-th ion (l=i, j) and the m-th motional mode (m=0, 1, ..., N−1), leaving the intensities $\alpha_s$ (s=1, 2, ..., $N_s$) of the pulse segments as control parameters.

In block 906, a set of N equations linear in terms of the intensities $\alpha_s$ (s=1, 2, ..., $N_s$) of the pulse segments, is generated by requiring that the computed values $\alpha_{l,m}(\tau)$ equal zero for the l-th ion (l=i, j) and the m−th motional mode (m=0, 1, ..., N−1).

In block 908, the set of linear equations are solved to obtain multiple sets of solutions for the intensities $\Omega_s$ (s=1, 2, ..., $N_s$). Among the sets of solution, a single set of solution for the intensities $\Omega_s$ (s=1, 2, ..., $N_s$) that yields the highest XX-gate fidelity is chosen.

In block 910, the pulse sequence $\Omega(t)$ is generated by combining the pulse segments having the determined intensities $\Omega_s$ (s=1, 2, ..., $N_s$) and ramps using splines at a start and an end of each pulse segment in the form of sine-squared function with the ramp duration $t_R$ selected in block 902. This generated pulse sequence $\Omega(t)$ is applied to the i-th and j-th qubits to perform a XX-gate operation on the i-th and j-th qubits.

Motional Mode Corrections

Figure 10:
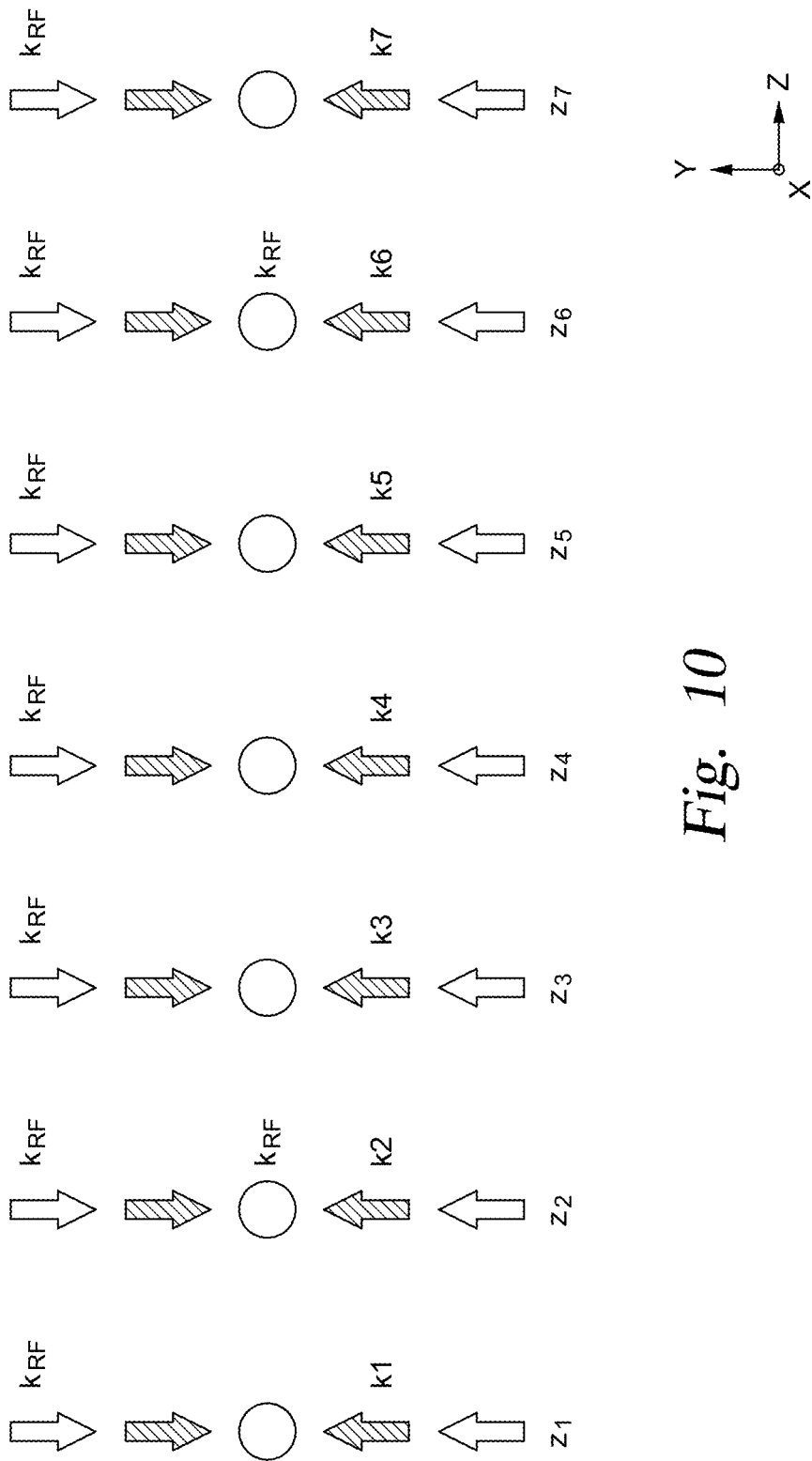
FIG. 10 depicts a chain of seven trapped ions with RF and DC spring constants that confine each ion in the transverse direction.

FIG. 10 depicts an example chain 102 of seven ions confined in the radial direction by a quadrupole potential generated by the ion trap 200. The quadrupole potential generated by the ion trap 200 and applied to ions in the chain 102 has an RF component and a DC component. The transverse restoring force due to the RF component of the quadrupole potential and the DC component of the quadrupole potential are modeled by RF spring constants $k_{RF}$ and DC spring constants $k_i$ respectively, for i-th ion (i=1, 2, ..., 7) as illustrated with solid arrows in FIG. 10.

In the ion trap quantum computer system 100, there can be discrepancies in the actual longitudinal distribution of the ions from the ideal longitudinal distribution (in which the ions are nearly equally spaced), due to stray electric fields along with the locally varying DC quadrupole potential along the chain 102. Thus, there can be discrepancies in the actual motional mode structures from the ideal motional mode structures (based on the ideal longitudinal distribution of the ions), and thus lead to degraded fidelity of the XX-gate if a segmented pulse sequence $\Omega(t)$ to perform the XX-gate is generated based on the ideal longitudinal distribution. Thus, in some embodiments described herein, the actual longitudinal distribution of the ions and the motional mode frequencies $\omega_m$ (m=0, 1, ..., N−1) are measured in the ion trap quantum computer system 100. The actual motional mode structures and the Lamb-Dicke parameter $\eta_{i,m}$ are computed based on the measured actual longitudinal distribution of the ions and the measured motional mode frequencies $\omega_m$ (m=0, 1, ..., N−1). These values are selected as input parameters in block 902 of the method 900 in generating an improved segmented pulse sequence $\Omega(t)$ to perform a XX-gate operation.

Figure 11:
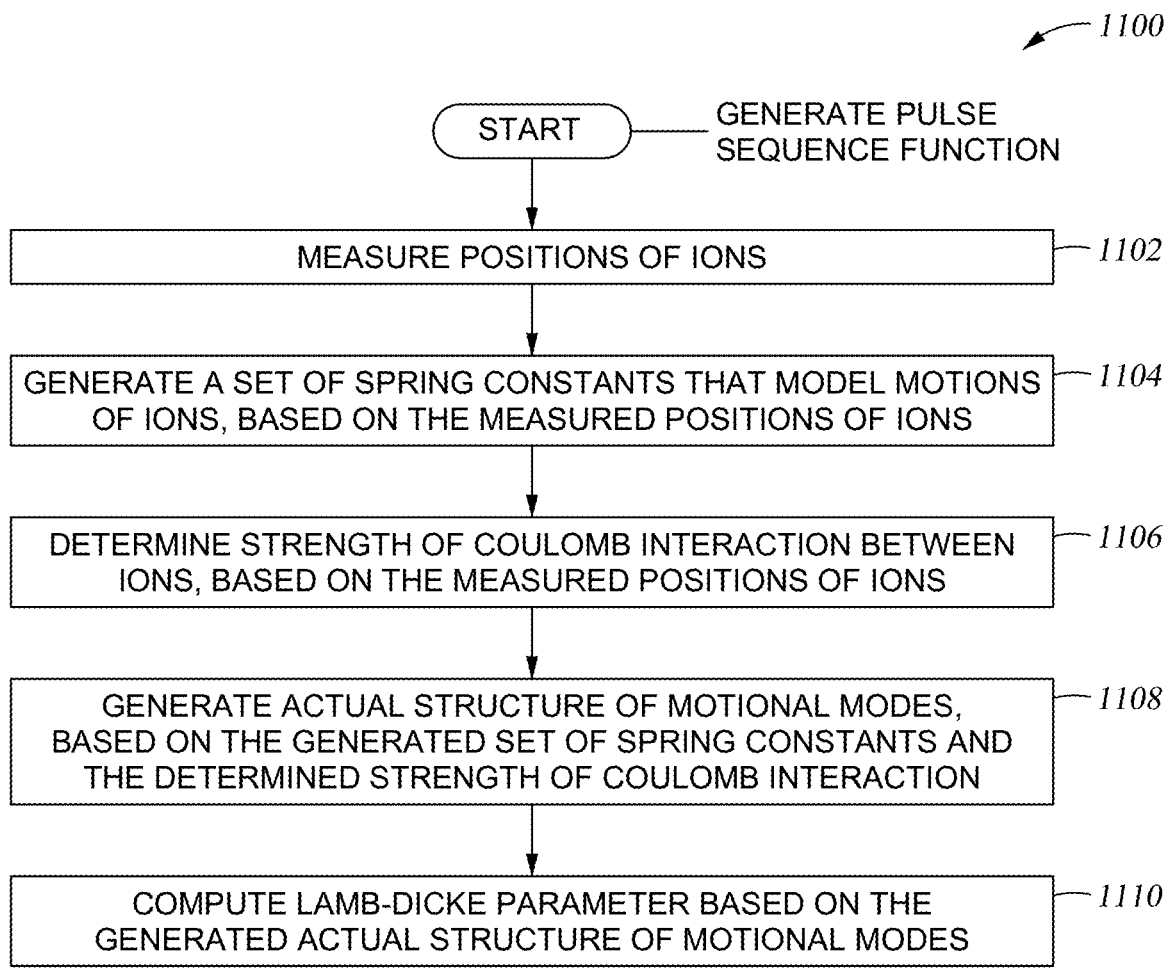
FIG. 11 depicts a flowchart illustrating a method to generate and determine actual motional mode structures of a chain of trapped ions according to one embodiment.

FIG. 11 depicts a flowchart illustrating a method 1100 that includes various steps performed that are used to generate and determine actual motional mode structures of a chain 102 of N trapped ions according to one embodiment.

In block 1102, the positions of the ions in the longitudinal direction (denoted as $z_1, z_2, ..., z_7$ in FIG. 10) are precisely measured by collecting generated fluorescence along the Y-axis from the ions to image them on a camera or the PMT 106 using the imaging objective 104.

In block 1104, based on the measured positions of the ions in the longitudinal direction, a set of spring constants $k_i$ for i-th ion (i=1, 2, ... N) in the chain 102 is generated, where the set of spring constants is used to model the restoring force in the transverse direction on the i-th ion. In generating a set of spring constants $k_i$ for i-th ion (i=1, 2, ... N), the motion of each ion in the transverse direction is approximated as a harmonic oscillation under the influence of the RF and DC spring constants $k_{RF}$ and $k_i$, respectively. The DC spring constants $k_i$ are computed based on the actual positions of the ions measured in block 1102.

In block 1106, based on the measured spacing of the ions (i.e., the distance between the measured positions of adjacent ions) in the longitudinal (axial) direction, the strength of the Coulomb interaction between ions is computed.

In block 1108, actual motional mode structures are generated based on the set of DC spring constants $k_i$ for i-th ion (i=1, 2, ... N) generated in block 1104, the strength of the Coulomb interaction generated in block 1108, and the RF spring constant $k_{RF}$ that is uniform along the ion chain.

In block 1110, the Lamb-Dicke parameter $\eta_{i,m}$ (m=0, 1, ..., N−1) are subsequently computed based on the actual motional mode structures. These Lamb-Dicke parameters are selected as input parameters in block 902 of the method 900 for generating an improved segmented pulse sequence $\Omega(t)$ to perform a XX-gate operation with improved fidelity.

Figure 12A:
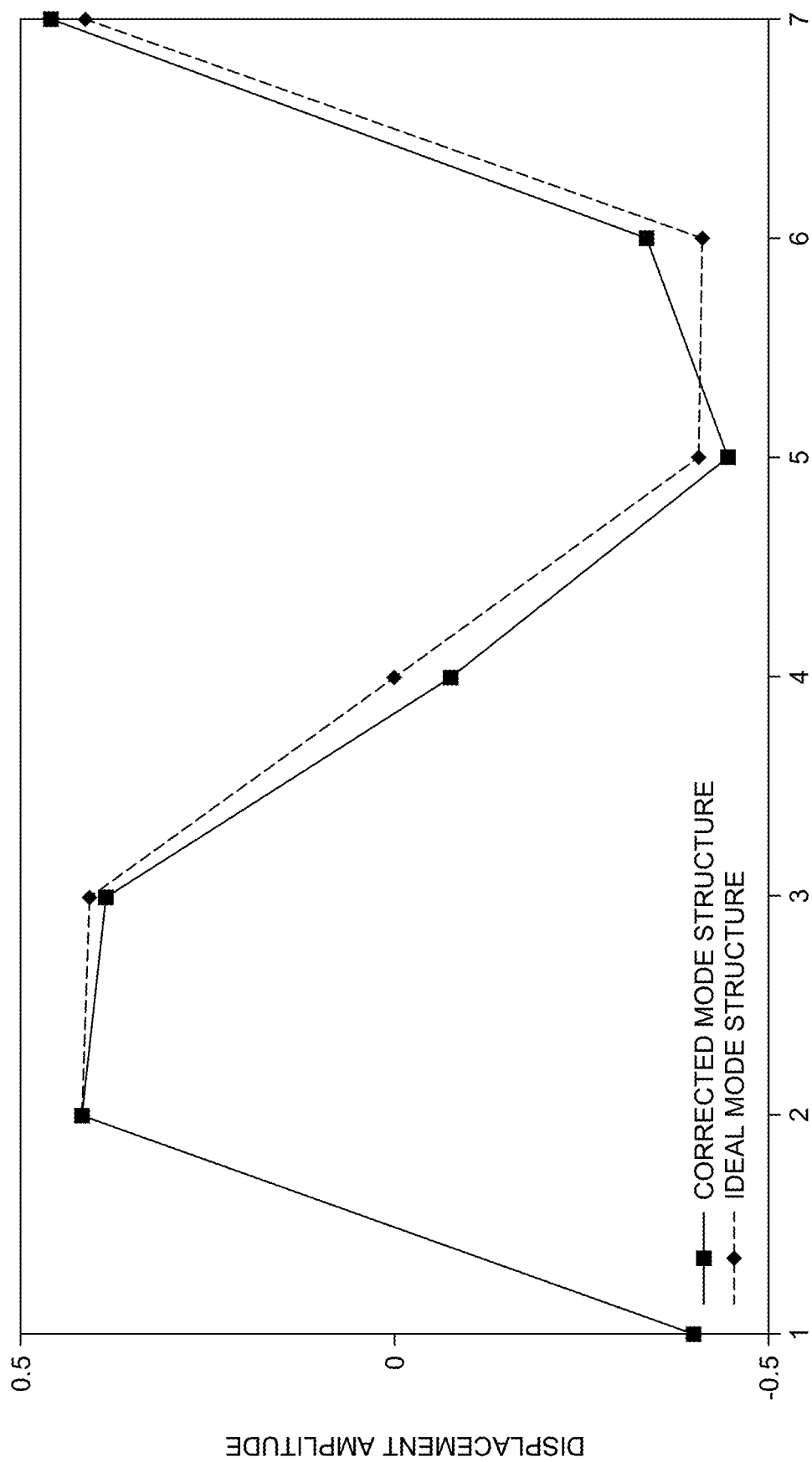
FIGS. 12A and 12B depict an example of motional mode structures of a chain of seven trapped ions corrected by a method according to one embodiment.
Figure 12B:
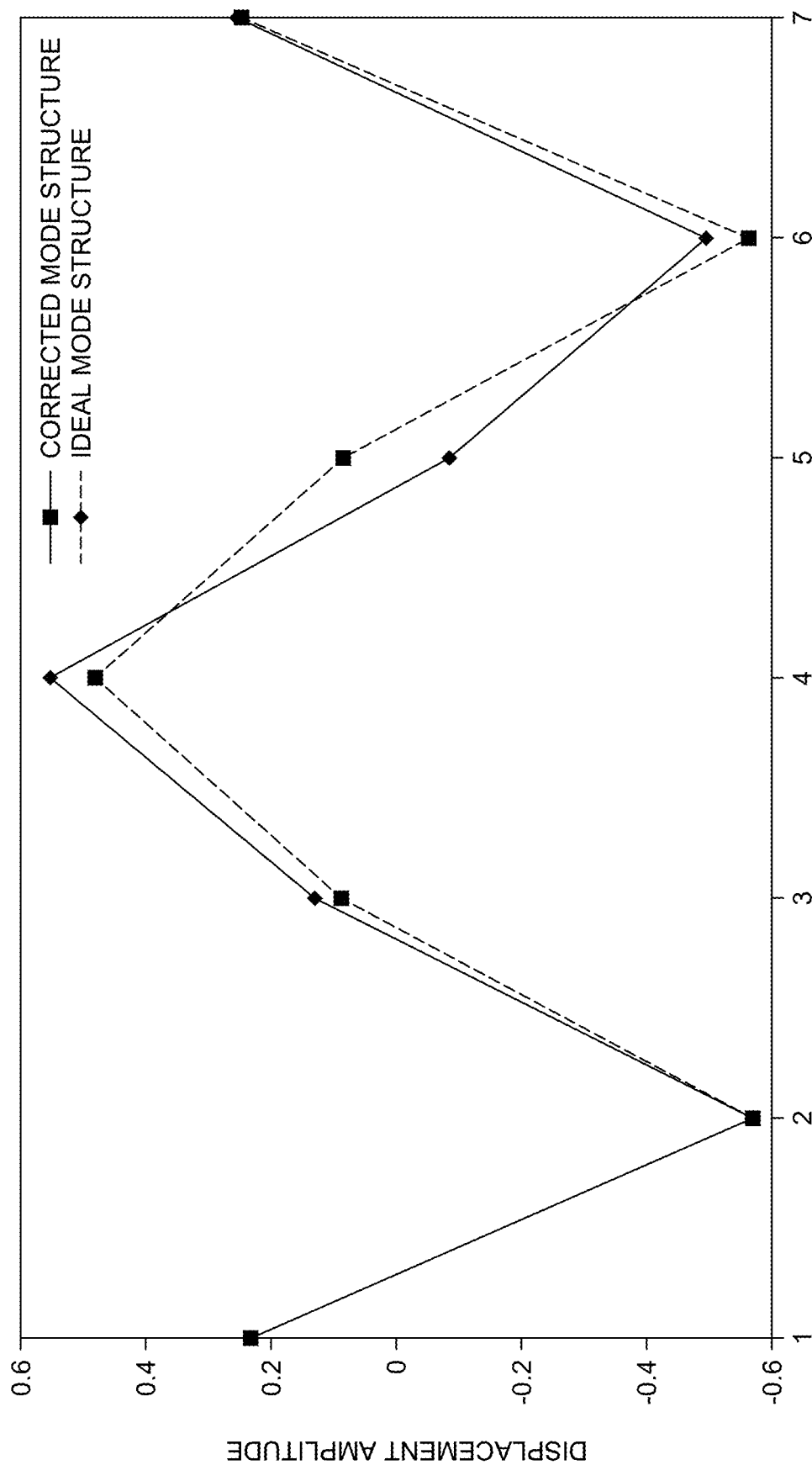
Figure 12C:
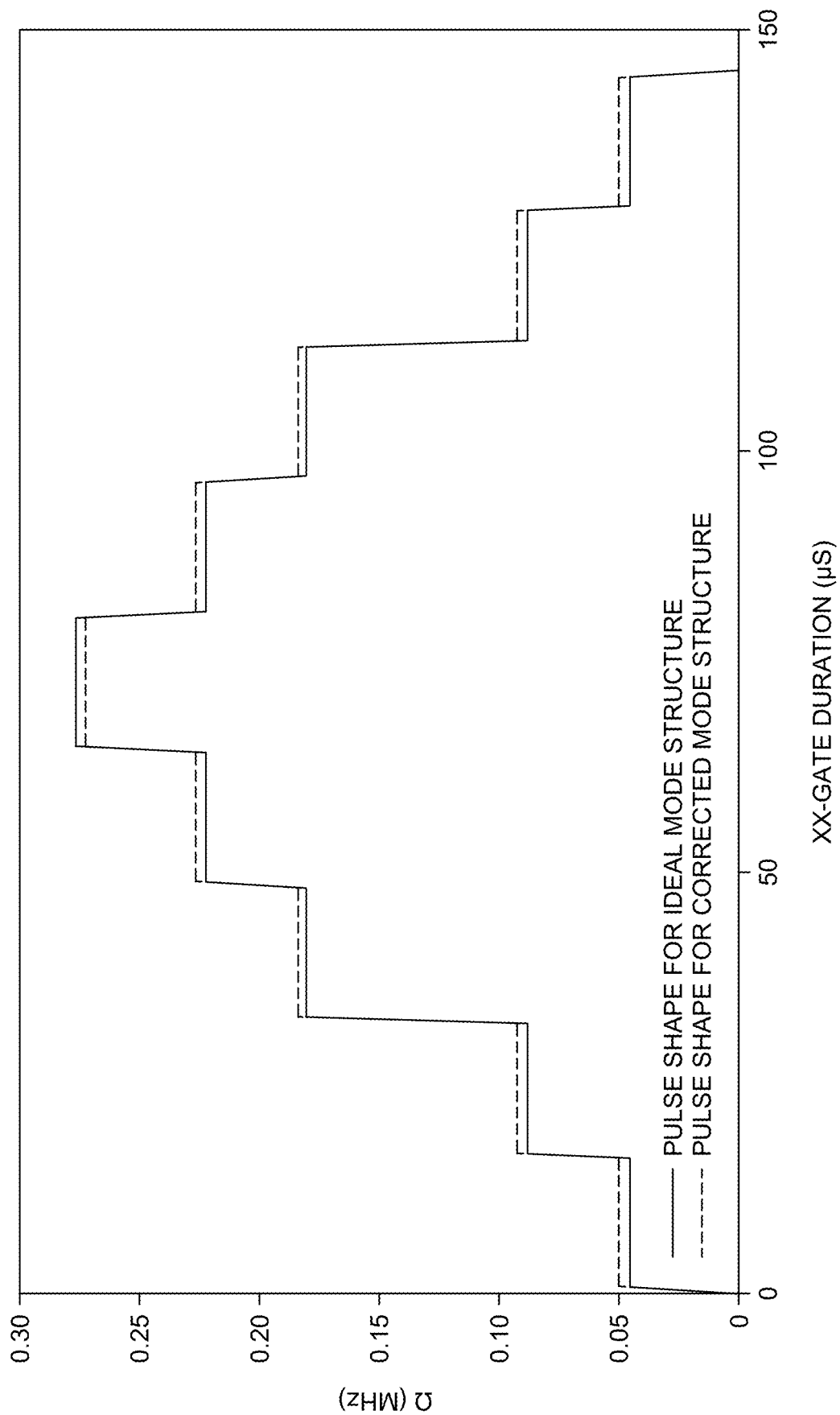
FIG. 12C depicts a comparison of a laser pulse sequence obtained using the ideal motional mode structures and actual motional mode structures.

FIGS. 12A and 12B depict an example of motional mode structures of a chain 102 of seven trapped ions corrected by the method 1100 described above. FIGS. 12A and 12B respectively depict ideal motional mode structures in dotted lines (i.e., the motional mode structures based on the ideal longitudinal distribution of the ions and the RF and DC spring constants that are uniform along the chain) and actual motional mode structures (i.e., the motional mode structures corrected by the method 1100) in solid lines for the 4th and 5th motional modes, respectively. The vertical axes represent displacement amplitudes of the seven ions in the chain 102 in the transverse direction. FIG. 12C depicts a comparison of the pulse sequence $\Omega_i(t)$ generated to perform a XX-gate operation obtained using the ideal motional mode structures and the actual motional mode structures formed by using the motional mode corrections determined by the steps found in method 1100. The pulse sequence $\Omega_i(t)$ generated or altered based on the actual motional mode structures improves fidelity of the XX-gate operation.

Calibration of XX-Gate

Single- and two-qubit gates operations are driven by the counter-propagating laser beams in the Raman configuration as shown in FIG. 4, where the two-photon transition detuning frequency $\delta$ of the laser beams is either tuned to resonance with the carrier transition ($\delta=0$) or close to a motional mode frequency $\omega_m$ ($\delta=\pm+\mu$, where $\mu$ is close to $\omega_m$). In both cases, phases of the laser beams are imprinted on the qubits that are driven by the laser beams during the gate operations. However, due to differences between chosen laser beam parameters for the single-qubit and two-qubit gate operations, such as differences in the optical quality of the laser beams, and differences in which the internal atomic structure are used in the Raman configuration, the imprinted phase might be different for different ions and/or different gate operations. This is a source of error in quantum computation and can be removed by characterizing offsets in the imprinted phases brought about by the single-qubit and two-qubit gate operation at each qubit. In some embodiments, the differences in the imprinted phases are removed by first preforming a single-qubit gate operation on i-th and j-th ions and imprinting single-qubit gate phases $\phi_i$ and $\phi_j$ on the i-th and j-th ions, respectively, and subsequently adjusting a two-qubit gate phase such that the two-qubit gate phase matches the single-qubit gate phases. The single-qubit phases $\phi_i$ and $\phi_j$ can also be considered as phase offsets between a single-qubit and two-qubit gate operations for the i-th and j-th ions, respectively.

Figure 13:
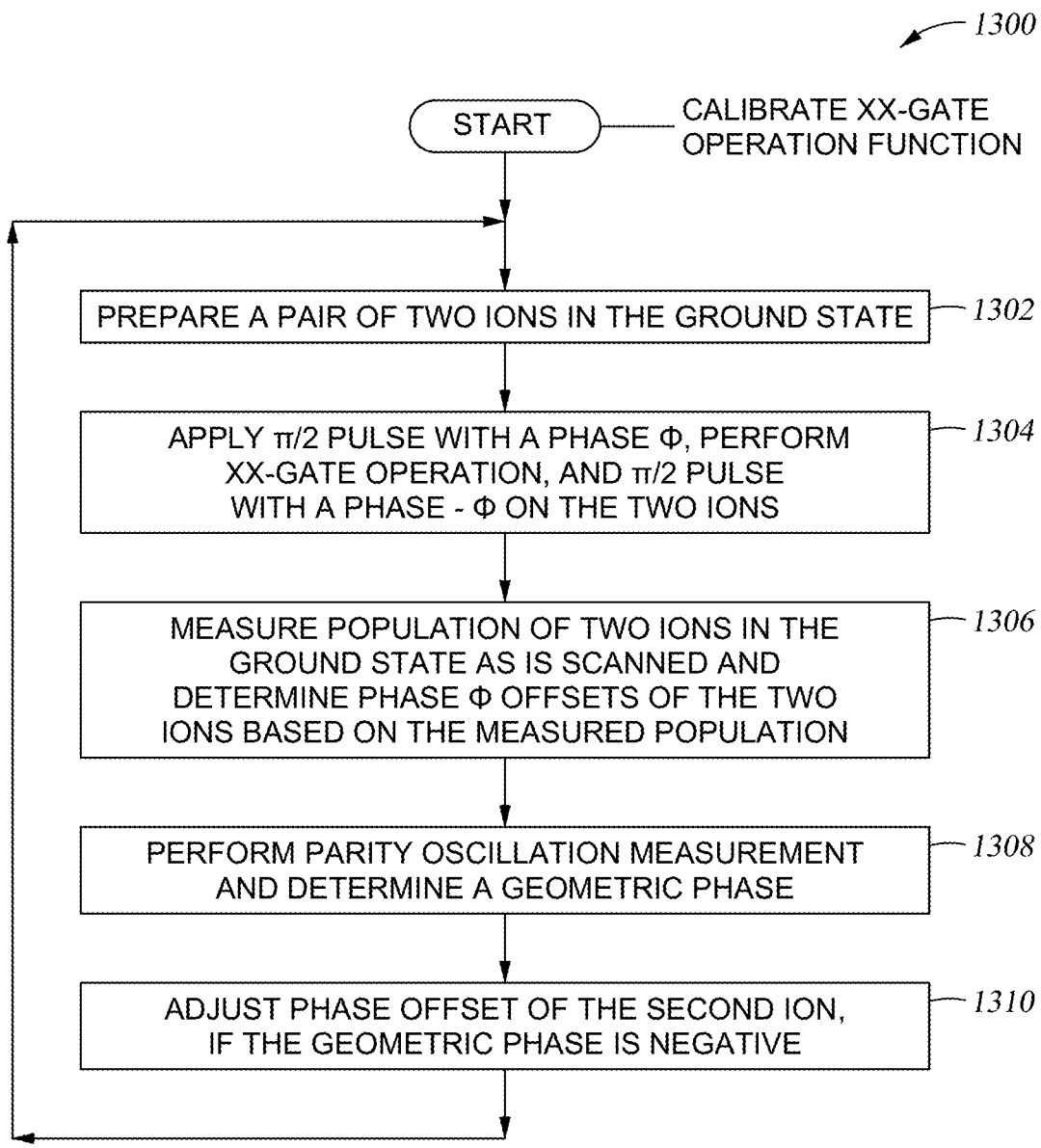
FIG. 13 depicts a flowchart illustrating a method to determine phase offsets and calibrate an XX-gate operation according to one embodiment.
Figure 14A:
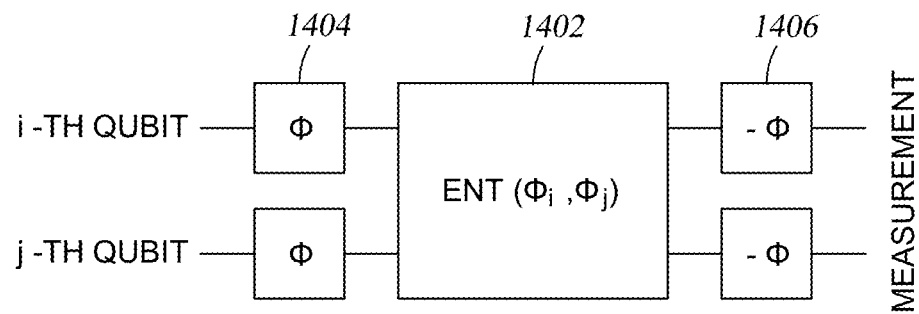
FIG. 14A depicts a schematic view of a gate sequence for determining phase offsets.

FIG. 13 depicts a flowchart illustrating a method 1300 that includes various steps performed that are used to determine the phase offsets $\phi_i$ and $\phi_j$ (i.e., rotations about the Z-axis on the Bloch sphere) of i-th and j-th qubits and use this information to calibrate the imprinted phase of the XX-gate operation (i.e., adjust one of the phase offsets $\phi_i$ and $\phi_j$) on the i-th and j-th qubits according to one embodiment. The method 1300 is described in conjunction with FIGS. 14A to 14D. FIG. 14A depicts a schematic view of a gate sequence for determining phase offsets. In FIG. 14A, the XX gate operation having phase offsets $\phi_i$ and $\phi_j$ is denoted as a box 1402 and applied to i-th and j-th qubits, respectively.

In block 1302, i-th and j-th qubits are prepared so that they are both in the hyperfine ground state $|0\rangle_i |0\rangle_j$ by known laser cooling methods, such as Doppler cooling or resolved sideband cooling, and optical pumping.

In block 1304, a $\pi/2$ pulse with a phase $+\phi$ 1404 and a $\pi/2$ pulse with a phase $-\phi$ 1406 are applied to both qubits before and after the application of the XX-gate operation (with $\chi_{i,j}(\tau)=\pi/4$) 1402, respectively.

Figure 14B:
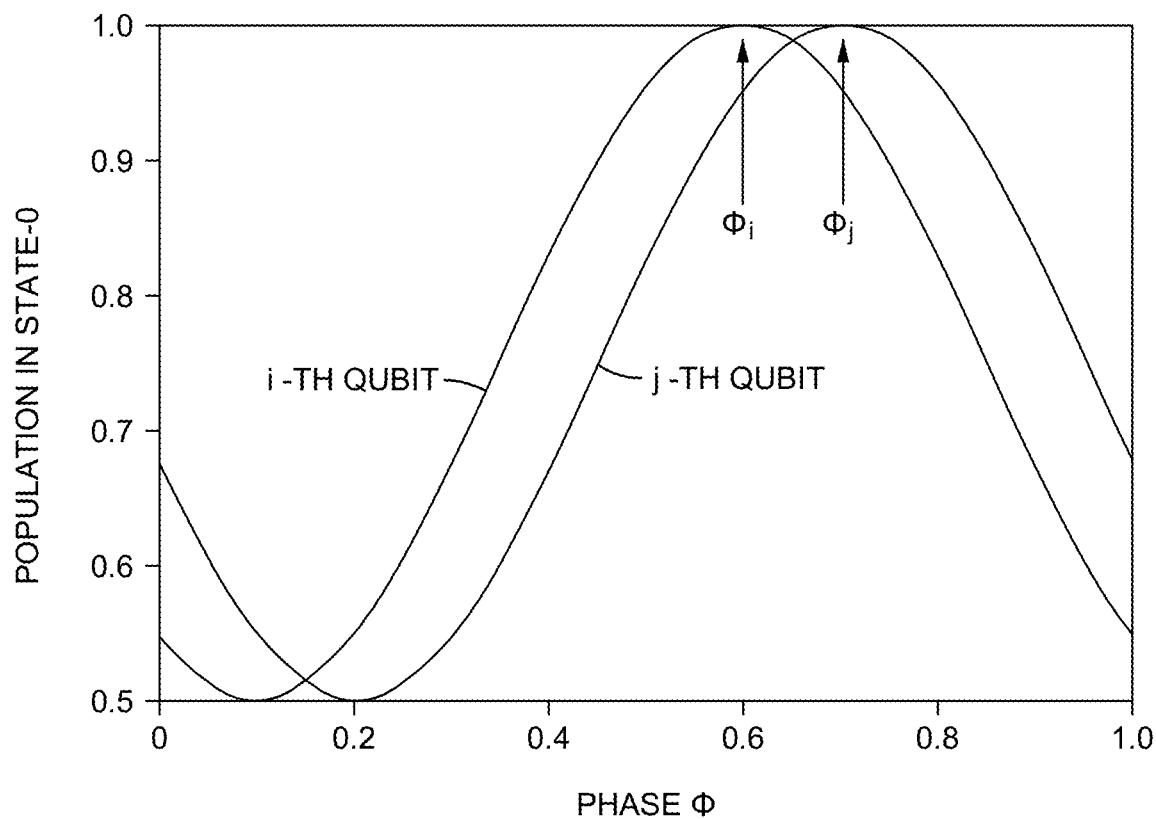
FIG. 14B depicts an example of population of the hyperfine ground state.

In block 1306, the population of the hyperfine ground state $|0\rangle$ is measured for by scanning the phase $\phi$. FIG. 14B depicts an example of the population of the i-th and j-th qubits in the hyperfine ground state $|0\rangle$. A value of the phase $\phi$ at which the population of the i-th qubit in the hyperfine ground state $|0\rangle$ has a maximum value corresponds to the phase offset $\phi_i$ of the i-th qubit. The phase offset $\phi_j$ of the j-th qubit is determined similarly. Thus, the XX-gate operation is correctly determined to transform two-qubit states $|0\rangle_i|0\rangle_j$, $|0\rangle_i|1\rangle_j$, $|1\rangle_i|0\rangle_j$, and $|1\rangle_i|1\rangle_j$ as follows:

$$|0\rangle_i|0\rangle_j \to |0\rangle_i|0\rangle_j - ie^{i(\phi_i+\phi_j)}|1\rangle_i|1\rangle_j$$

$$|0\rangle_i|1\rangle_j \to |0\rangle_i|1\rangle_j - ie^{i(\phi_i-\phi_j)}|1\rangle_i|0\rangle_j$$

$$|1\rangle_i|0\rangle_j \to -ie^{-i(\phi_i-\phi_j)}|0\rangle_i|1\rangle_j + |1\rangle_i|0\rangle_j$$

$$|1\rangle_i|1\rangle_j \to -ie^{-i(\phi_i+\phi_j)}|0\rangle_i|0\rangle_j + |1\rangle_i|1\rangle_j.$$

After phase offsets $\phi_i$ and $\phi_j$ of the i-th and j-th qubits are determined, the phases of the laser beams that drive the XX-gate operation are adjusted accordingly such that $\phi_i$ and $\phi_j$ are both zero.

Figure 14C:
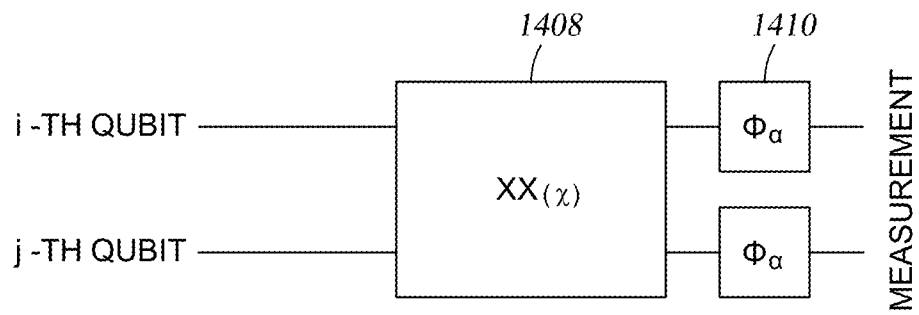
FIG. 14C depicts a schematic view of a gate sequence for a parity measurement on two qubits.
Figure 14D:
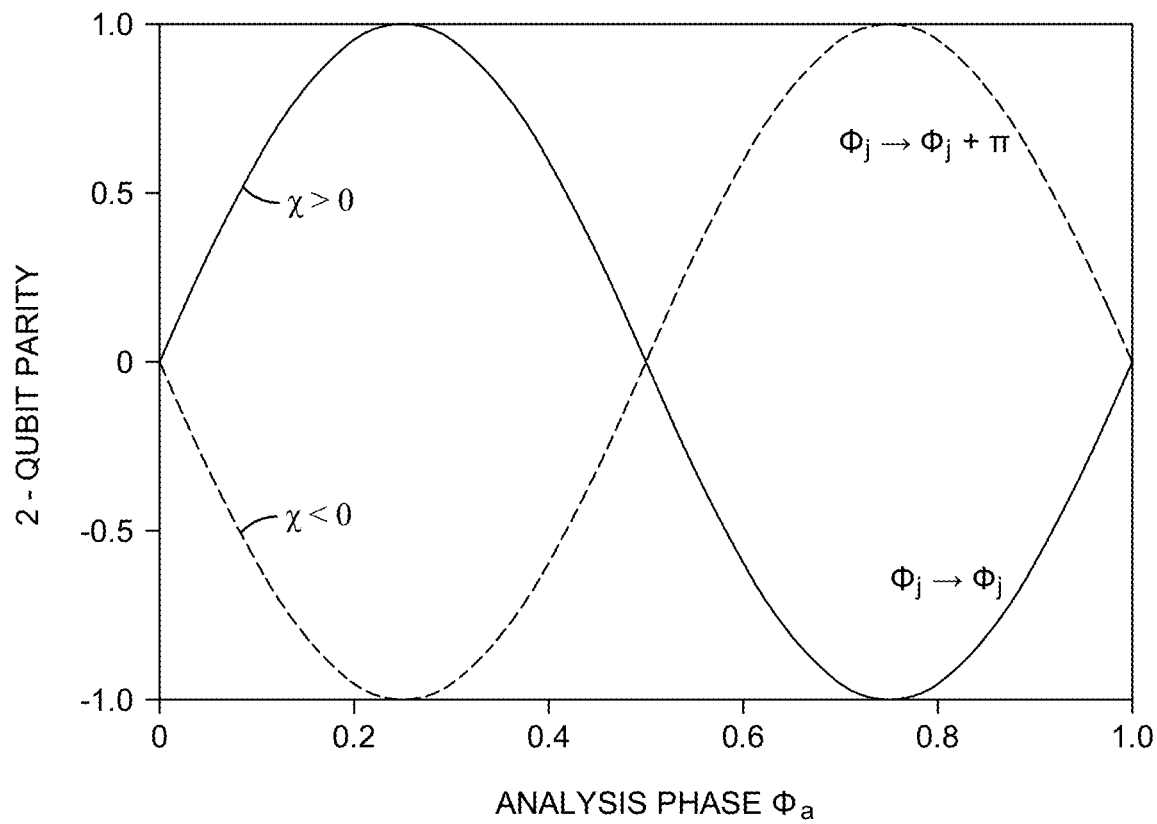
FIG. 14D depicts parity oscillation as an analysis phase is scanned.

In block 1308, a phase adjusted XX-gate (with $\phi_i=0$ and $\phi_j=0$ and absolute value of the entangling interaction, also referred to as a geometric phase, $|\chi_{i,j}(\tau)|=\pi/4$) is applied in a gate sequence as shown in FIG. 14C. This sequence is used to measure parity oscillations of the two-qubit state when an XX-gate operation 1408 is applied on the i-th and j-th qubits followed by analysis pulses 1410, which are $\pi/2$ pulses with an analysis phase $\phi_a$. The parity (i.e., population of the combined states $|0\rangle_i|0\rangle_j$ and $|1\rangle_i|1\rangle_j$ minus the populations in states $|0\rangle_i|1\rangle_j$ and $|1\rangle_i|0\rangle_j$) is measured as the analysis phase $\phi_a$ is scanned. As depicted in FIG. 14D, the parity oscillates as the analysis phase $\phi_a$ is varied between 0 and $2\pi$ (normalized to 1 in FIGS. 14B and 14D). When the geometric phase $\chi_{i,j}(\tau)$ (referred to simply as $\chi$) is positive, the parity increases as the analysis shift $\phi_a$ is increased from zero. When the geometric phase $\chi$ is negative, the parity decreases as the analysis phase $\phi_a$ is increased from zero.

In block 1310, the calibration for the phase offset $\phi_j$ is adjusted based on the parity measured in block 1308. If the geometric phase $\chi$ is negative, the calibration for the phase offset $\phi_j$ is replaced by that for the phase offset $\phi_j+\pi$ (i.e., j-th qubit is rotated about the Z-axis on the Bloch sphere by $\pi$). If the geometric phase $\chi$ is positive, the calibration for the phase offset $\phi_j$ is kept unchanged. The calibration for the phase offset $\phi_i$ of the other ion i is kept unchanged.

In block 1312, steps of blocks 1302 to 1308 are repeated for all pairs of qubits such that an XX-gate operation for each pair of qubits has a positive geometric phase $\chi$. For example, in a chain of seven trapped ions, steps of blocks 1302 to 1308 are repeated for all 21 pairs of qubits. Thus, the XX-gate operation for each pair of qubits can be calibrated (i.e. the imprinted phase offsets are adjusted) to improve the fidelity of the XX-gate operation.

Optimization of Detuning and Gate Duration

Figure 15:
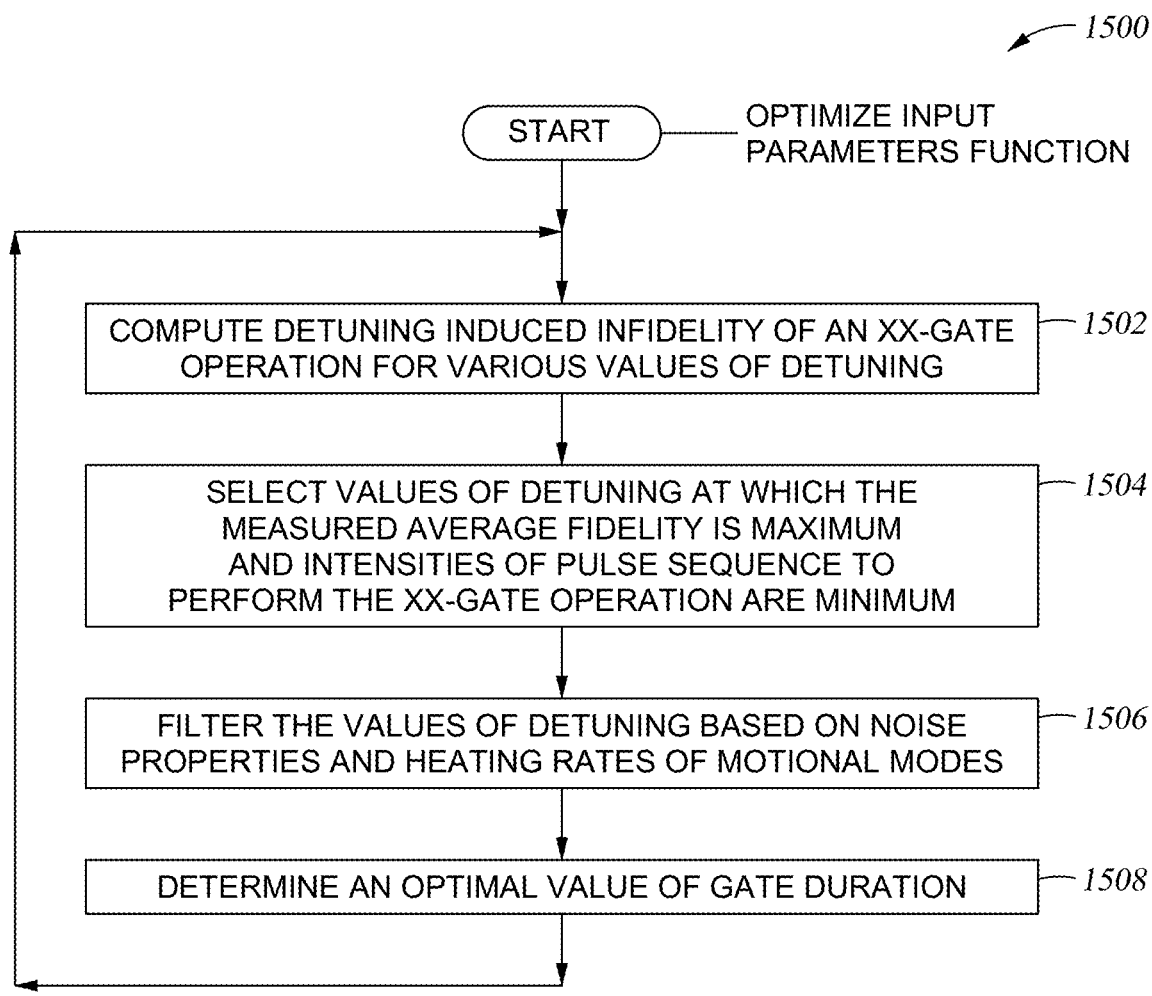
FIG. 15 depicts a flowchart illustrating a method to optimize gate duration and detuning frequency according to one embodiment.

FIG. 15 depicts a flowchart illustrating a method 1500 that includes various steps performed that are used to optimize the gate duration $\tau$ and the detuning $\mu$ according to one embodiment.

In block 1502, a segmented pulse sequence $\Omega(t)$ to perform a XX-gate operation is generated by the method 900 for a given value of detuning $\mu$, based on values for the gate duration $\tau$ and the ramp duration $t_R$ selected in block 902, the actual motional mode structures generated by the method 1100, and experimentally measured mode frequencies $\omega_m$ (m=1, 2, . . . , N). For optimizing the segmented pulse sequence $\Omega(t)$, an average infidelity of an XX-gate operation (i.e., a discrepancy between the XX-gate gate operation implemented by the segmented pulse sequence $\Omega(t)$ and the ideal XX-gate operation) is computed over a small variation or collective drift in the motional mode frequencies. That is, the detuning $\mu$ is varied within a small range, the infidelity of the XX-gate operation is computed for each value of the detuning $\mu$, and the computed infidelity of the XX-gate operation is averaged over the range that the detuning $\mu$ is varied. This variation of the infidelity of the XX-gate operation is referred to as the detuning induced infidelity. The computation of the detuning induced infidelity of the XX-gate operation is repeated for values of the detuning $\mu$ in a frequency range which spans all or some the motional mode frequencies $\omega_m$ (m=1, 2, ..., N).

In block 1504, values of the detuning parameter $\mu$, at which the infidelity has a minimum value and the determined intensities $\Omega_s$ of the pulse segments have minimum values (thus minimizing the required laser powers), are chosen as the optimal values for the detuning $\mu$. These values for the detuning $\mu$ thus chosen yield the segmented pulse sequence $\Omega(t)$ that are both robust against a variation of the detuning $\mu$ as well as require lower laser intensities.

Figure 16A:
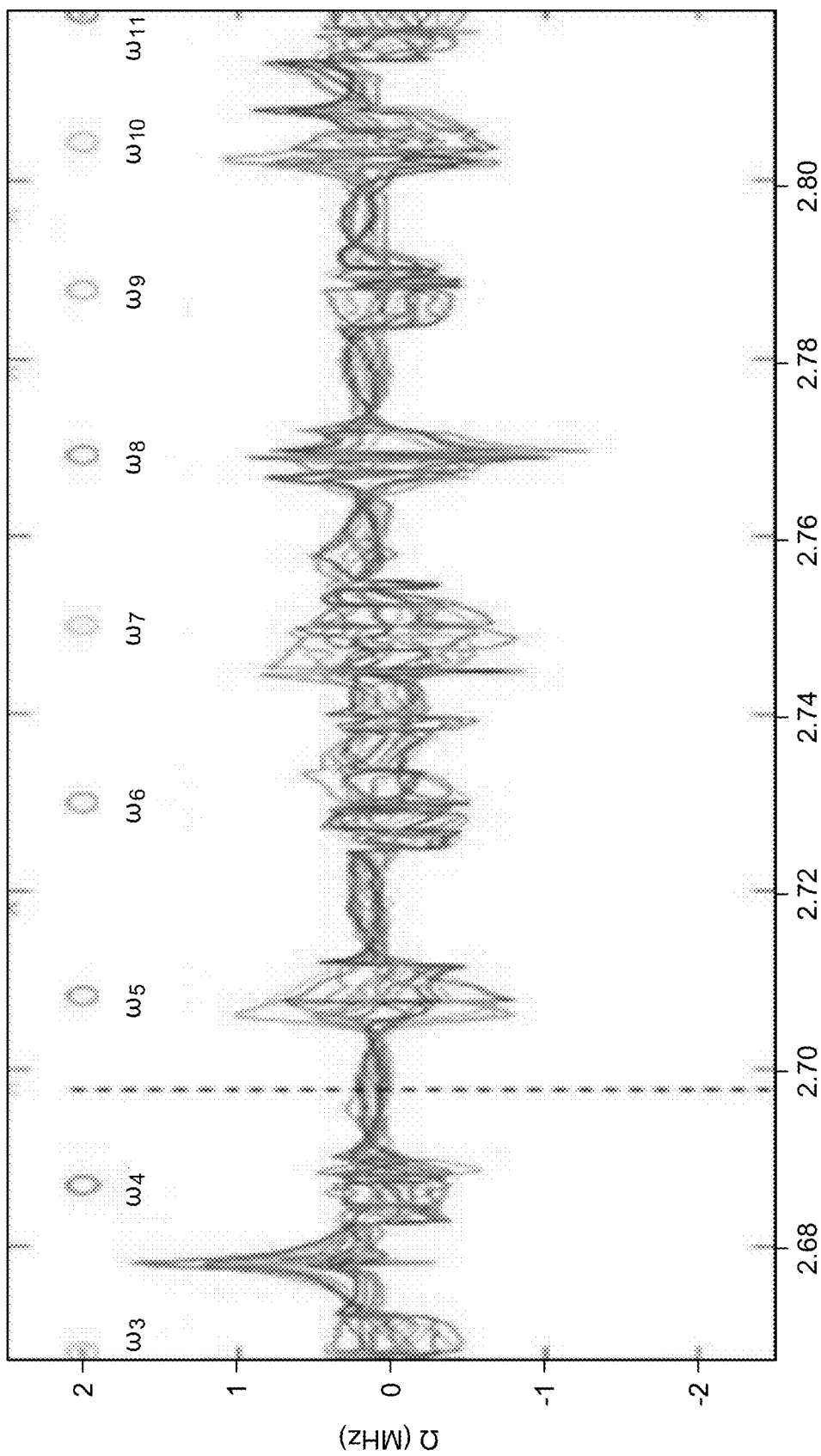
FIG. 16A depicts variations of determined intensities of laser pulse segments for a chain of thirteen trapped ions as detuning frequency is scanned according to one embodiment.
Figure 16B:
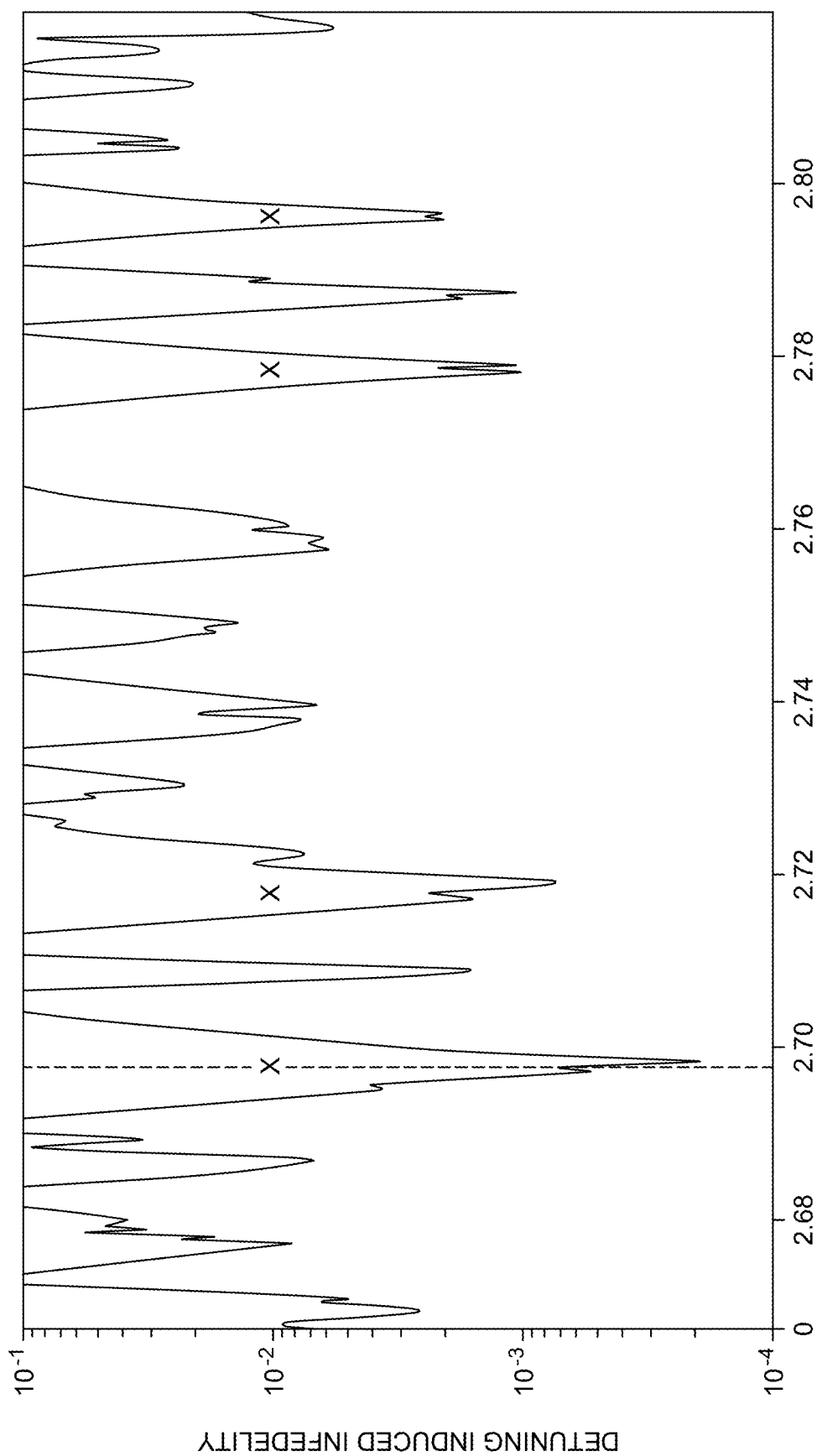
FIG. 16B depicts computed detuning frequency induced infidelity of a XX-gate operation.

FIG. 16A depicts variations of the determined intensities $\Omega_s$ of the pulse segments for a chain 102 of thirteen trapped ions as the detuning $\mu$ is scanned in a frequency range between the frequencies $\omega_3$ and $\omega_{11}$ of the third and eleventh motional modes. FIG. 16B depicts the computed detuning induced infidelity of the XX-gate operation as the detuning $\mu$ is varied within a small range (typically of the order of 1 kHz). At the detuning $\mu$ of approximate values of 2.698 MHz, 2.72 MHz, 2.78 MHz, and 2.995 MHz (denoted by "$\chi$" in FIG. 16B), the detuning induced infidelity and the determined intensities $\Omega_s$ are at their minimum values, and thus one of these values for the detuning $\mu$ is chosen as the optimal value of the detuning $\mu$ with the corresponding pulse sequence $\Omega(t)$ as the optimized pulse sequence $\Omega(t)$ to perform a high fidelity XX-gate operation.

Figure 17:
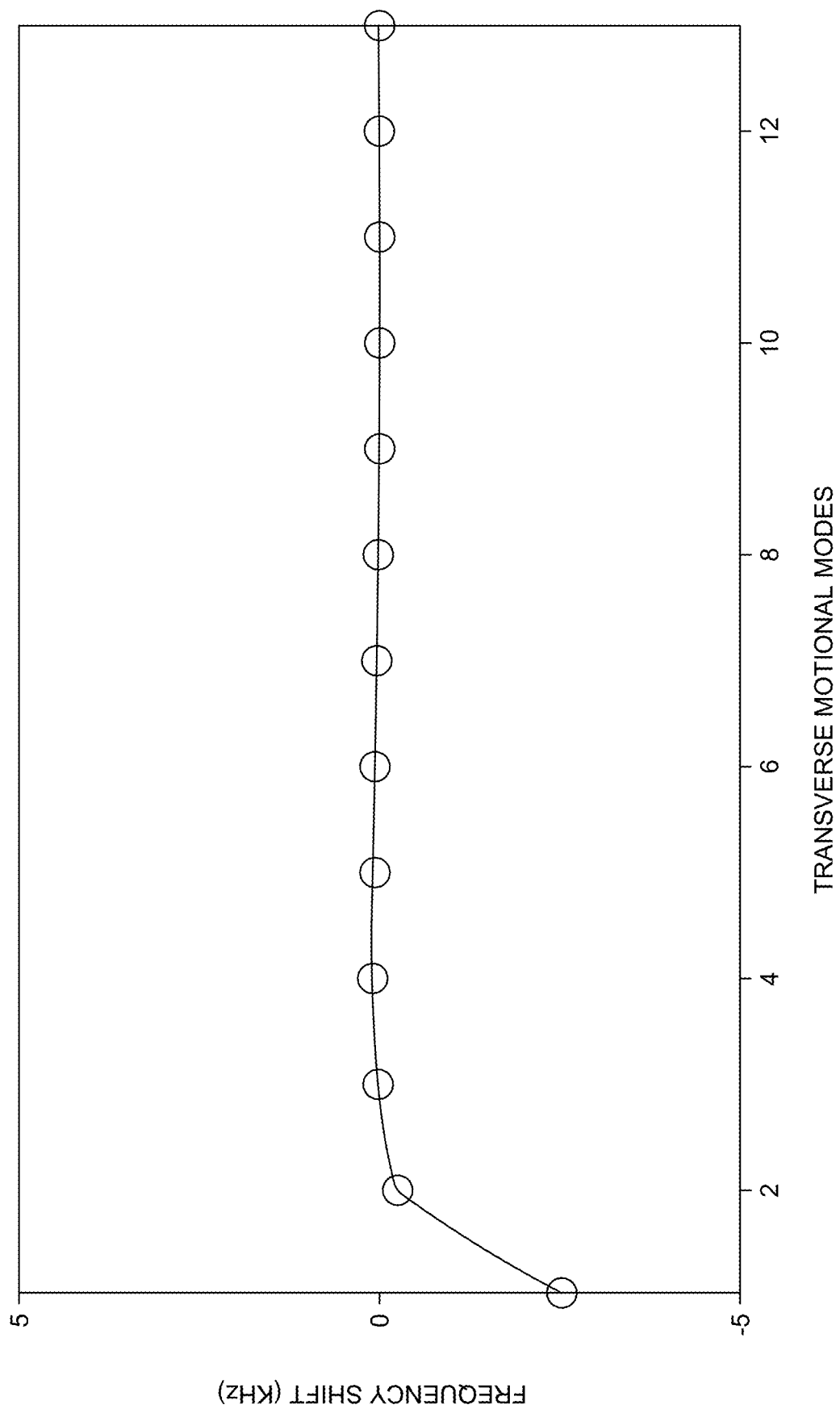
FIG. 17 depicts simulated frequency shift of motional mode frequencies of a chain of thirteen trapped ions.

In block 1506, the optimized pulse sequence $\Omega(t)$ is filtered such that the corresponding value of the detuning $\mu$ is within a useful range based on noise properties of the motional modes. FIG. 17 shows an example of the simulated frequency shifts of the motional mode frequencies of all 13 transverse motional modes in a chain 102 of 13 trapped ions subject to a stray electric field of 4V/m along the chain 102. Based on the simulated frequency shifts, it is evident that the lowest two motional modes suffer from a frequency shift which can introduce substantial error in the XX-gate operation at the detuning $\mu$ close to the motional mode frequencies $\omega_1$ and $\omega_2$. Therefore, the optimized pulse sequence $\Omega(t)$ to perform an XX-gate operation is chosen for implementation only when the detuning $\mu$ is larger than the motional mode frequency $\omega_3$. This determines the lower bound of the detuning $\mu$ for generating the optimized pulse sequence $\Omega(t)$ as reflected in FIGS. 16A and 16B. Additionally, the optimized pulse sequence $\Omega(t)$ is filtered such that the XX-gate operation is made insensitive to heating of the motional modes by excluding the motional modes that are measured to have high rates of heating. In an example of a chain of thirteen qubits, the heating rate on the center of mass mode which is the 13-th motional mode (i.e., the common motional mode, in general the N-th motional mode of a chain of N ions) is measured to be relatively high in comparison to other motional modes. In order to exclude the utilization of this motional mode in an XX-gate operation a range in which the detuning $\mu$ for generating an optimized pulse sequence $\Omega(t)$ is set to have an upper limit at the motional mode frequency $\omega_{11}$ where the tilt motional mode frequency $\omega_{12}$ is also excluded as it is close to the common motional mode frequency $\omega_{13}$. By choosing the detuning $\mu$ in a range between the lower limit and the upper limit, the optimized pulse sequence $\Omega(t)$ can perform a XX-gate operation that is insensitive to the motional mode heating and the motional mode frequency shifts due to stray electric fields.

In block 1508, an optimal value of the gate duration $\tau$ is determined by iterating steps in blocks 1502 to 1506. A value of the gate duration $\tau$ in generating the pulse sequence $\Omega(t)$ to perform an XX-gate operation while minimizing required intensities $\Omega_s$ of the pulse segments and the detuning induced infidelity of the XX gate operation. As a starting point the gate duration is set to be $\tau=\alpha/\overline{\Delta\omega_m}$, where $\beta$ is a gate duration factor and $\overline{\Delta\omega_m}$ is an average difference between adjacent motional mode frequencies within the range of the detuning $\mu$ as determined in block 1506. It has been observed that while reducing the gate duration factor $\beta$ generally reduces the detuning induced infidelity at optimal values of the detuning $\mu$ (see FIG. 16A), reducing the gate duration factor $\beta$ also increases the determined intensities $\Omega_S$ of the pulse segments required to achieve maximal entanglement where $\chi_{i,j}(\tau)=\pi/4$. The increased intensities $\Omega_S$ of the pulse segments due to shortened gate duration $\tau$ may require higher intensities of the laser beams to perform a XX-gate operation. Thus, there is a trade-off between a reduction of the detuning induced infidelity and a reduction in the required intensities of the laser beams which ultimately determines the optimal value of the gate duration $\tau_{OPT}$ through multiple iterations of steps in blocks 1502-1506. It should be noted that the trend of the detuning induced infidelity and the intensities $\Omega_S$ of the pulse segments with respect to the gate duration $\tau$ may not always be monotonic as described above and can be complicated thereby requiring sophisticated learning algorithms to determine both the optimal gate duration $\tau_{OPT}$ and the number of pulse segments $N_S$ in the pulse sequence $\Omega(t)$ to perform a XX-gate operation, through iterations of steps in blocks 1502 to 1506 and may also include the optimization of the number of pulse segments $N_S$.

A segmented pulse sequence generated as described above may perform an entangling operation between two qubits with improved fidelity. In generating such improved pulse sequence to perform an entangling gate operation, input parameters (the gate duration $\tau$, the detuning $\mu$) are optimized, the motional modes frequencies ($\omega_m$) are accurately measured, the motional mode structures are determined. Based on the optimized input parameters, measured motional modes frequencies, and the generated motional mode structures, intensities of each of pulse segments of the segmented pulse sequence are determined, and the resulting segmented pulse sequence can applied to perform an XX-gate operation with improved fidelity.

Additionally, each of the pulse segments in the improved segmented pulse sequence has a pulse shape with ramps at a start and an end thereof, which is used to reduce infidelity from off-resonant carrier excitations. Calibration of the XX-gate operation to adjust imprinted phase shifts in each qubit further improves the fidelity of the XX-gate operation.

While the foregoing is directed to specific embodiments, other and further embodiments may be devised without departing from the basic scope thereof, and the scope thereof is determined by the claims that follow.

The invention claimed is:

1. A method of performing a computational process using a quantum computer, comprising:

generating a laser pulse sequence comprising a plurality of laser pulse segments used to perform an entangling gate operation on a first trapped ion and a second trapped ion of a plurality of trapped ions that are aligned in a first direction, each of the trapped ions having two frequency-separated states defining a qubit; and applying the generated laser pulse sequence to the first and second trapped ions, wherein each of the plurality of laser pulse segments has a pulse shape with ramps formed using a spline at a start and an end of each of the plurality of laser pulse segments.

2. The method according to claim 1, further comprising:
determining an intensity of each of the plurality of laser pulse segments based on a value of an entangling interaction between the first and second trapped ions and values of phase space trajectories of the first and second trapped ions in a second direction that is perpendicular to the first direction.

3. The method according to claim 2, further comprising:
measuring positions of the plurality of trapped ions in the first direction;

determining, based on the measured positions of the plurality of trapped ions, a set of spring constants of harmonic oscillations that approximate motions of the plurality of trapped ions in the second direction;

determining, based on the measured positions of the plurality of trapped ions, a strength of the Coulomb interaction between each pair of the plurality of trapped ions; and generating, based on the determined set of spring constants and the determined strength of the Coulomb interaction, motional mode structures of collective motional modes of the plurality of trapped ions, wherein the value of the entangling interaction between the first and second trapped ions and the values of the phase space trajectories of the collective motional modes for the first and second trapped ions are determined further based on the generated motional mode structures.

4. The method according to claim 3, further comprising selecting a gate duration value and a detuning value of the laser pulse sequence; and measuring frequencies of the collective motional modes of the plurality of trapped ions in the second direction.

5. The method according to claim 4, wherein the selecting of the detuning value of the laser pulse sequence comprise:
computing an average infidelity of the entangling gate operation based on detuning values; and selecting the detuning value at which the computed average infidelity of the entangling gate operation is minimum and the determined intensities of the plurality of laser pulse segments are minimum.

6. The method according to claim 4, further comprising:
selecting collective motional modes that are used in generating the laser pulse sequence, comprising:
computing frequency shifts of the collective motional modes due to an electric field applied in the first direction;

determining collective motional modes that have a larger frequency shift than other collective motional modes; and choosing a first detuning value that negligibly excites the determined collective motional modes during an entangling gate operation, wherein the selecting the detuning value is based on the chosen first detuning value.

7. The method according to claim 4, further comprising:
selecting collective motional modes that are used in generating the laser pulse sequence, comprising:
measuring heating rates of the collective motional modes during an application of the laser pulse sequence;

determining collective motional modes that have a larger heating rate than other collective motional modes; and choosing a first detuning value that negligibly excites the determined collective motional modes during an entangling gate operation, wherein the selecting the detuning value is based on the chosen first detuning value.

8. The method according to claim 1, further comprising:
calibrating a first phase offset of the first trapped ion and a second phase offset of the second trapped ion; and calibrating, based on the calibrated first and second phase offsets, the entangling gate operation.

9. A non-transitory computer-readable medium including computer program instructions, which when executed by a processor, cause the processor to:

generate a laser pulse sequence comprising a plurality of laser pulse segments used to perform an entangling gate operation on a first trapped ion and a second trapped ion of a plurality of trapped ions that are aligned in a first direction, each of the trapped ions having two frequency-separated states; and apply the generated laser pulse sequence to the first and second trapped ions, wherein each of the plurality of laser pulse segments has a pulse shape with ramps formed using a spline at a start and an end of each of the plurality of laser pulse segments.

10. The non-transitory computer-readable medium according to claim 9, wherein the computer program instructions further cause the processor to:

determine an intensity of each of the plurality of laser pulse segments based on a value of an entangling interaction between the first and second trapped ions and values of phase space trajectories of the first and second trapped ions in a second direction that is perpendicular to the first direction.

11. The non-transitory computer-readable medium according to claim 10, wherein the computer program instructions further cause the processor to:

measure positions of the plurality of trapped ions in the first direction;

determine, based on the measured positions of the plurality of trapped ions, a set of spring constants of harmonic oscillations that approximate motions of the plurality of trapped ions in the second direction; and determine, based on the measured positions of the plurality of trapped ions, a strength of the Coulomb interaction between each pair of the plurality of trapped ions; and generate, based on the determined set of spring constants and the determined strength of the Coulomb interaction, motional mode structures of collective motional modes of the plurality of trapped ions, wherein the value of the entangling interaction between the first and second trapped ions and the values of the phase space trajectories of the collective motional modes for the first and second trapped ions are computed further based on the generated motional mode structures.

12. The non-transitory computer-readable medium according to claim 11, wherein the computer program instructions further cause the processor to:
select a gate duration value and a detuning value of the laser pulse sequence; and
measure frequencies of the collective motional modes of the plurality of trapped ions in the second direction.

13. The non-transitory computer-readable medium according to claim 12, wherein the computer program instructions further cause the processor to:
compute an average infidelity of the entangling gate operation based on detuning values; and
select the detuning value at which the computed average infidelity of the entangling gate operation is minimum and the determined intensities of the plurality of laser pulse segments are minimum.

14. The non-transitory computer-readable medium according to claim 12, wherein the computer program instructions further cause the processor to:
compute frequency shifts of the collective motional modes due to an electric filed applied in the first direction;
determine collective motional modes that have a larger frequency shift than other collective motional modes; and
choose a first detuning value that negligibly excites the determined collective motional modes during an entangling gate operation,
wherein the detuning value is selected based on the chosen first detuning value.

15. The non-transitory computer-readable medium according to claim 12, wherein the computer program instructions further cause the processor to:
measure heating rates of the collective motional modes during an application of the laser pulse sequence;
determine collective motional mode that has a larger heating rate than other collective motional modes; and
choose a first detuning value that negligibly excites the determined collective motional modes during an entangling gate operation,
wherein the detuning value is selected based on the chosen first detuning value.

16. The non-transitory computer-readable medium according to claim 9, wherein the computer program instructions further cause the processor to:
calibrate a first phase offset of the first trapped ion and a second phase offset of the second trapped ion; and
calibrate, based on the calibrated first and second phase offsets, the entangling gate operation.

17. A quantum computing system, comprising:
a plurality of trapped ions that are aligned in a first direction, each of the trapped ions having two hyperfine states defining a qubit;
one or more lasers configured to emit a laser beam that is split into a pair of non-copropagating laser beams having a first frequency and a second frequency that is provided to a first trapped ion and a second trapped ion of the plurality of trapped ions, wherein the pair of non-copropagating laser beams are configured to cause Rabi flopping of the first trapped ion and the second trapped ion between each of the two hyperfine states and the excited state, and
a controller configured to:
generate a laser pulse sequence comprising a plurality of laser pulse segments used to perform an entangling gate operation on the first trapped ion and the second trapped ion; and
apply the generated laser pulse sequence to the first and second trapped ions, and
each of the plurality of laser pulse segments has a pulse shape with ramps formed using a spline at a start and an end of each of the plurality of laser pulse segments.

18. The quantum computing system according to claim 17, wherein each ion of the plurality of trapped ions is $^{171}Yb^+$ having the $^2S_{1/2}$ hyperfine states.

19. The quantum computing system according to claim 17, wherein the controller is further configured to:
determine an intensity of each of the plurality of laser pulse segments based on a value of an entangling interaction between the first and second trapped ions and the values of phase space trajectories of the first and second trapped ions in a second direction that is perpendicular to the first direction.

20. The quantum computing system according to claim 19, wherein the controller is further configured to:
measure positions of the plurality of trapped ions in the first direction;
determine, based on the measured positions of the plurality of trapped ions, a set of spring constants of harmonic oscillations that approximate motions of the plurality of trapped ions in the second direction;
determine, based on the measured positions of the plurality of trapped ions, a strength of the Coulomb interaction between each pair of the plurality of trapped ions; and
generate, based on the determined set of spring constants and the determined strength of the Coulomb interaction, motional mode structures of collective motional modes of the plurality of trapped ions,
wherein the value of the entangling interaction between the first and second trapped ions and the values of the phase space trajectories of the collective motional modes for the first and second trapped ions are further based on the generated motional mode structures.

* * * * *